(12) United States Patent
Morishita

(10) Patent No.: US 7,906,990 B2
(45) Date of Patent: Mar. 15, 2011

(54) SEMICONDUCTOR INTEGRATED CIRCUIT DEVICE

(75) Inventor: Fukashi Morishita, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/677,745

(22) PCT Filed: Sep. 19, 2008

(86) PCT No.: PCT/JP2008/067011
§ 371 (c)(1),
(2), (4) Date: Mar. 11, 2010

(87) PCT Pub. No.: WO2009/044642
PCT Pub. Date: Apr. 9, 2009

(65) Prior Publication Data
US 2010/0188120 A1    Jul. 29, 2010

(30) Foreign Application Priority Data
Oct. 1, 2007   (JP) ................. 2007-257068

(51) Int. Cl.
*H01L 25/00*  (2006.01)
*H03K 19/00*  (2006.01)
*H03K 19/20*  (2006.01)

(52) U.S. Cl. .......... 326/101; 326/33; 326/120; 257/348; 257/402

(58) Field of Classification Search ................ None
See application file for complete search history.

(56) References Cited

U.S. PATENT DOCUMENTS

| | | | |
|---|---|---|---|
| 5,594,371 A | | 1/1997 | Douseki |
| 6,232,793 B1 * | | 5/2001 | Arimoto et al. ............... 326/34 |
| 6,603,175 B2 * | | 8/2003 | Kadowaki et al. ............ 257/347 |
| 6,818,496 B2 * | | 11/2004 | Dennison et al. ............. 438/239 |
| 7,639,044 B2 * | | 12/2009 | Ito et al. ......................... 326/83 |
| 2001/0035774 A1 | | 11/2001 | Kotani |
| 2004/0051556 A1 * | | 3/2004 | Shimazaki et al. ........... 326/80 |
| 2009/0015293 A1 * | | 1/2009 | Ito et al. ........................ 326/81 |

FOREIGN PATENT DOCUMENTS

| | | |
|---|---|---|
| JP | 8-228145 | 9/1996 |
| JP | 11-261072 | 9/1999 |
| JP | 2002-016260 | 1/2002 |
| JP | 2003-101407 | 4/2003 |
| JP | 2004-179269 | 6/2004 |

OTHER PUBLICATIONS

Kenichi Shimomura et al., "Body Seigyo Gijutsu o Saiyo shita 1V 46ns 16Mbit SOI-DRAM no Sekkei Gijutsu," IEICE Technical Report, 1997, vol. 97, No. 56 (ICD97 20), pp. 31-36.
Kenichi Shimomura et al., "Body Seigyo Gijutsu o Saiyo shita 1V 46ns 16Mbit SOI-DRAM no Sekkei Gijutsu," IEICE Technical Report, 1997, vol. 97, No. 56 (ICD97 20), pp. 31-36.

* cited by examiner

*Primary Examiner* — Rexford N Barnie
*Assistant Examiner* — Jany Tran
(74) *Attorney, Agent, or Firm* — McDermott Will & Emery LLP

(57) ABSTRACT

The present invention provides a semiconductor integrated circuit device in which characteristics of an SOI transistor are effectively used to achieve higher speed, higher degree of integration, and also reduction in voltage and power consumption. The semiconductor integrated circuit device according to the present invention has a configuration in which a plurality of external power supply lines and body voltage control lines are alternately arranged in one direction so as to extend over the entire chip, which supply power and a body voltage to logic circuits, an analog circuit and memory circuits. A body voltage control type logic gate is fully applied in the logic circuit, whereas the body voltage control type logic gate is partially applied in the memory circuit.

9 Claims, 16 Drawing Sheets

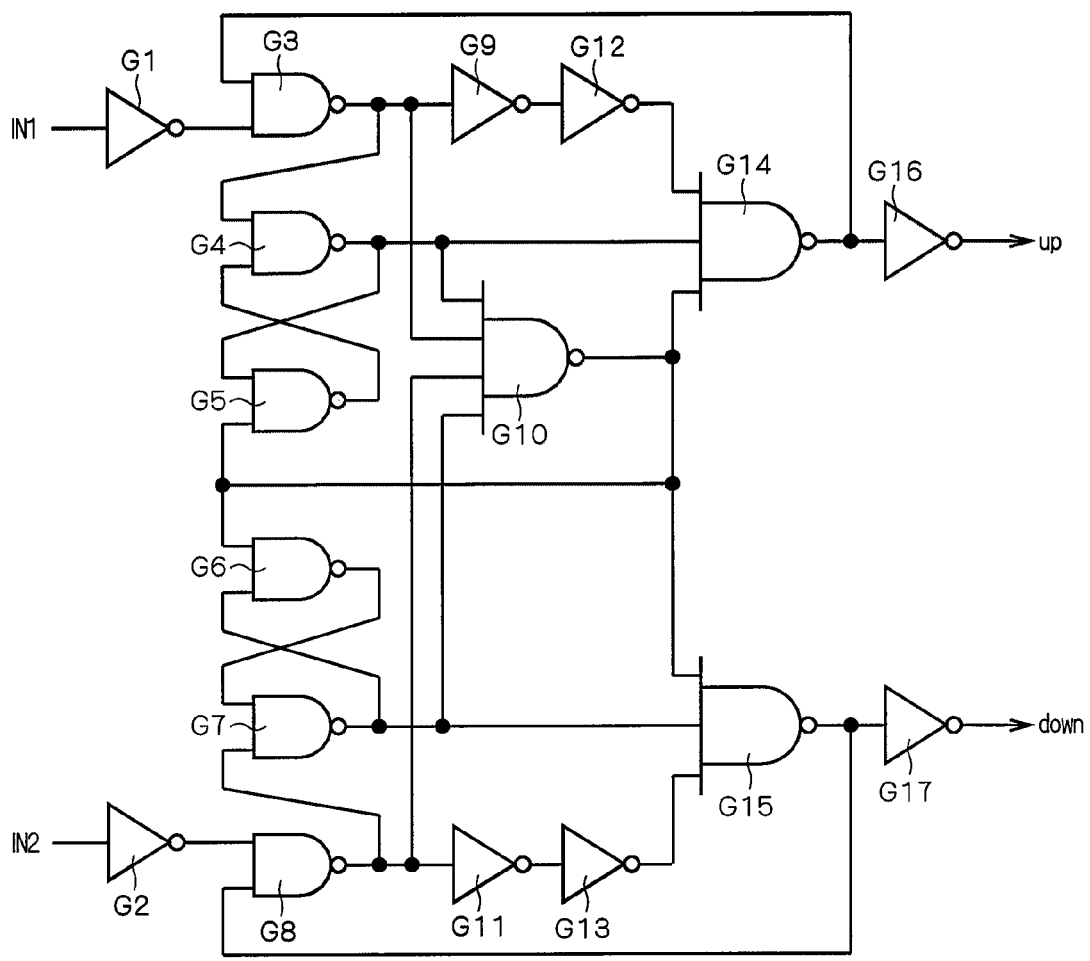
F I G . 1 5

Vdd2=0.5V (PARTIALLY-DEPLETED)

Vdd1=0.8V (FULLY-DEPLETED)

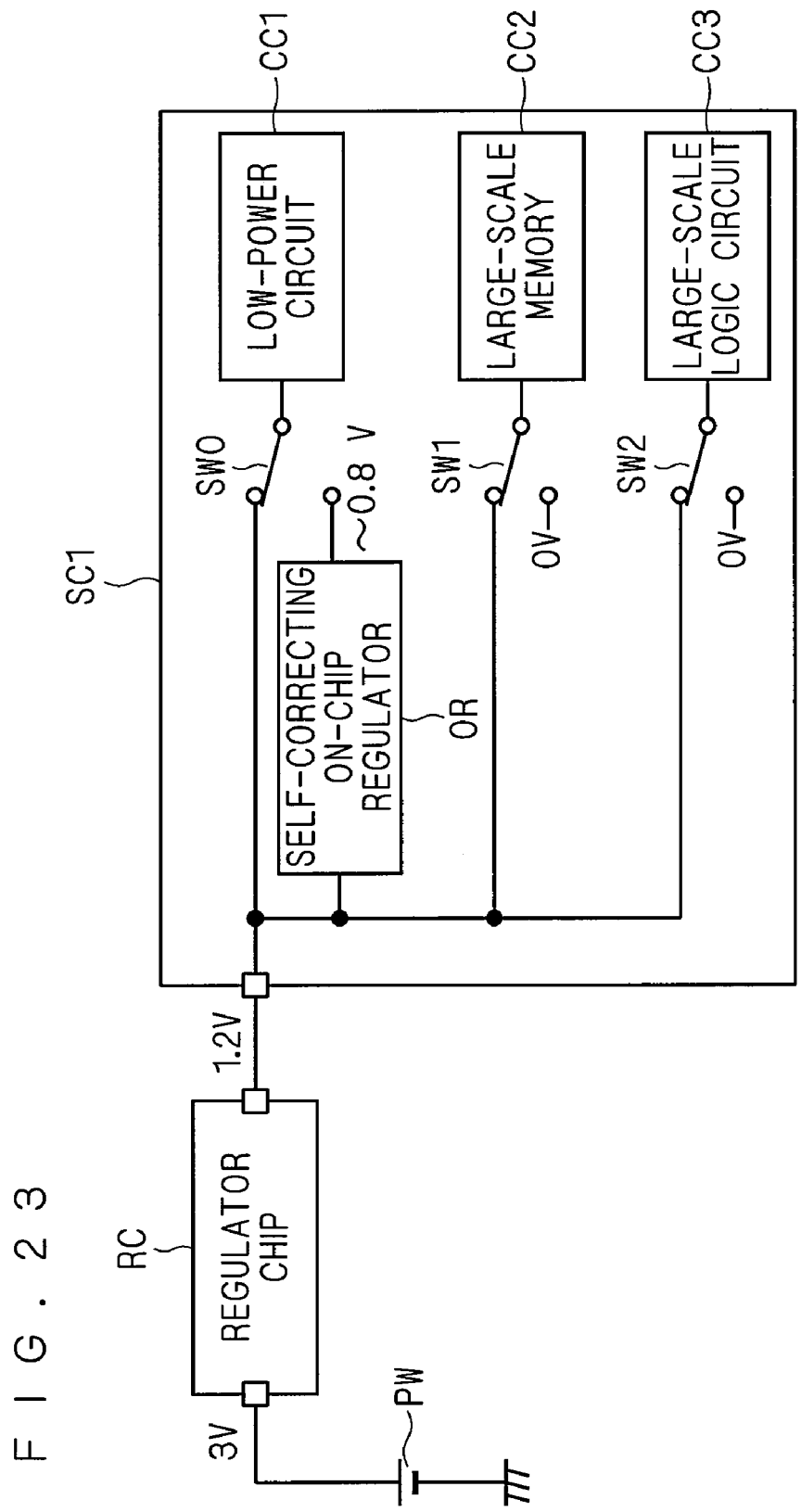
F I G. 23

SEMICONDUCTOR INTEGRATED CIRCUIT DEVICE

RELATED APPLICATIONS

This application is the U.S. National Phase under 35 U.S.C. §371 of International Application No. PCT/JP2008/067011, filed on Sep. 19, 2008, which in turn claims the benefit of Japanese Application No. 2007-257068, filed on Oct. 1, 2007, the disclosures of which Applications are incorporated by reference herein.

TECHNICAL FIELD

The present invention relates to a semiconductor integrated circuit device, and more particularly, to a semiconductor integrated circuit device having a low-voltage power down mode and a normal operation mode.

BACKGROUND ART

In recent years, the microprocessing technology is progressing for achieving higher speed and higher degree of integration of a semiconductor integrated circuit device. Along with this, variations in process, voltage and temperature (PVT) affect device characteristics more remarkably, and accordingly the technology of controlling an influence on the characteristics in an entire circuit against such variations becomes more and more important. Moreover, driving voltage becomes reduced along with the advance of technology, which results in a further increase in fluctuations of device characteristics which result from variations in PVT.

Against this background, a silicon-on-insulator (SOI) device is receiving attention in recent years. Particularly in the area of mobile devices, it becomes extremely important to reduce voltage and power consumption without sacrificing required performance. Under the circumstances, a limitation is being posed on scaling of a threshold value in a bulk silicon device, and hence it is difficult to make improvement in performance and operation with reduced power consumption compatible with each other in terms of leakage current.

For this reason, in the SOI device, a MOS transistor is formed on a thin silicon single crystal layer (SOI layer) disposed on a silicon oxide film (buried oxide film). As a result, not only side surfaces but also a bottom surface of a transistor active region is covered with the silicon oxide film. Therefore, compared with a MOS transistor formed on a bulk silicon substrate, PN junction area is reduced, and parasitic load capacitance is reduced by a larger amount, which enables high-speed operation and low-consumption-power operation.

This SOI device has a characteristic that a channel region (hereinafter, referred to as floating body, or merely as body) of a transistor is brought into an electrically floating state. One whose floating body is fully covered with a depletion layer during operation is referred to as a fully-depleted transistor, whereas one whose floating body includes a remaining region which is not depleted during operation is referred to as a partially-depleted transistor.

As to a partially-depleted transistor, for example, Patent Document 1 discloses a method of forming transistors having threshold values different from each other.

The partially-depleted transistor is only required to be formed on an SOI layer which is relatively thick, and thus has a characteristic that it is manufactured relatively with ease because substantially the same process as a typical bulk CMOS process is applied thereto.

Further, in the partially-depleted transistor, there is frequently used a mode of fixing a body potential by attaching an electrode to a body (body-fixing) to be used in a substrate-fixed mode similar to that of the bulk device. In this case, though static characteristics of the transistor are substantially the same as those of the bulk CMOS device, there is an advantage that it is possible to use the same platform (EDA tool, setting environment, library and IP) as that of the bulk CMOS device. Further, there is another advantage that the partially-depleted transistor operates at speed higher than the bulk CMOS device by 10 to 20% because an effect of reducing a parasitic capacitance is the same as that of the SOI device.

In contrast, in the fully-depleted transistor, there is no parasitic substrate capacitance below a gate electrode because a body is fully depleted, and thus speedup is expected further. However, the fully-depleted transistor needs to be formed on a thin SOI layer for fully depleting the body, and thus is not put to practical use from the viewpoints of processing technology and the like.

Patent Document 2 discloses a transistor which is brought into a fully-depleted mode during a circuit operation during which an ON state and an OFF state are repeated and brought into a partially-depleted mode during stand-by operation, in which switching between the modes is controlled by a voltage applied to a back gate electrode.

Patent Document 1: Japanese Patent Application Laid-Open No. 2002-16260 (FIGS. 4 and 5)
Patent Document 2: Japanese Patent Application Laid-Open No. 11-261072

DISCLOSURE OF INVENTION

Problem to be Solved by the Invention

As described above, the reality is that the fully-depleted transistor is not put to practical use but, as to a semiconductor integrated circuit device after a 45-nm generation in which a gate length of a transistor is approximately 45 nm, it is predicted that a fully-depleted transistor will appear on the market. Therefore, it is conceivable that higher speed and higher degree of integration will be achieved. In addition, it is predicted that increasing demands will be made upon reducing voltage and consumption power along with increasing speed and a degree of integration, but a semiconductor integrated circuit device capable of satisfying those demands has not been achieved.

The present invention has been made to solve the above-mentioned problem, and therefore an object thereof is to provide a semiconductor integrated circuit device which effectively uses characteristics of an SOI transistor and successfully reduces voltage and consumption power as well as increases speed and a degree of integration.

Means to Solve the Problem

In one embodiment of the present invention, a MOS transistor in which a depletion state of a body changes due to a change in power supply voltage is used, whereby a logic gate capable of obtaining the same delay time with respect to two different power supply voltages is achieved. A body voltage control type logic gate is fully applied in a logic circuit, whereas in a memory circuit, a body voltage control type logic gate is applied to a logic circuit contained therein.

Effects of the Invention

According to the above-mentioned embodiment, all operations are performed at 1.2 V during a normal operation, and power supply voltage is reduced to 0.8 V in a preset operation state, whereby it is possible to reduce power of main logic circuits.

These and other objects, features, aspects and advantages of the present invention will become more apparent from the following detailed description of the present invention when taken in conjunction with the accompanying drawings.

BRIEF DESCRIPTION OF DRAWINGS

FIG. 15 is a circuit diagram showing a configuration of a phase comparator.

FIG. 23 is a block diagram showing a configuration of a semiconductor integrated circuit device according to a fourth embodiment of the present invention.

BEST MODE FOR CARRYING OUT THE INVENTION

The term "MOS" has been previously used for the laminated structure of metal, oxide and semiconductor, which is an acronym for Metal-Oxide-Semiconductor. However, particularly in a field effect transistor having the MOS structure (hereinafter, merely referred to as "MOS transistor"), materials for a gate insulating film and a gate electrode are improved in terms of higher degree of integration or improvement of a manufacturing process these days.

For example, in the MOS transistor, mainly in terms of forming a source and a drain in a self-alignment manner, a polycrystalline silicon has been employed as a material for a gate electrode in place of metal. In addition, in terms of improving electric characteristics, a material having high dielectric constant is employed as a material for the gate insulating film, but the material is not necessarily limited to an oxide.

Therefore, the term "MOS" is not necessarily employed by being limited to the laminated structure of metal, oxide and semiconductor, and such limitation is not pre-assumed herein. That is, in view of common general technical knowledge, "MOS" is not only used as an abbreviation which arises from a word origin thereof, but also has a broad definition including the laminated structure of conductor, insulator and semiconductor as well.

A. First Embodiment

Figure 1:
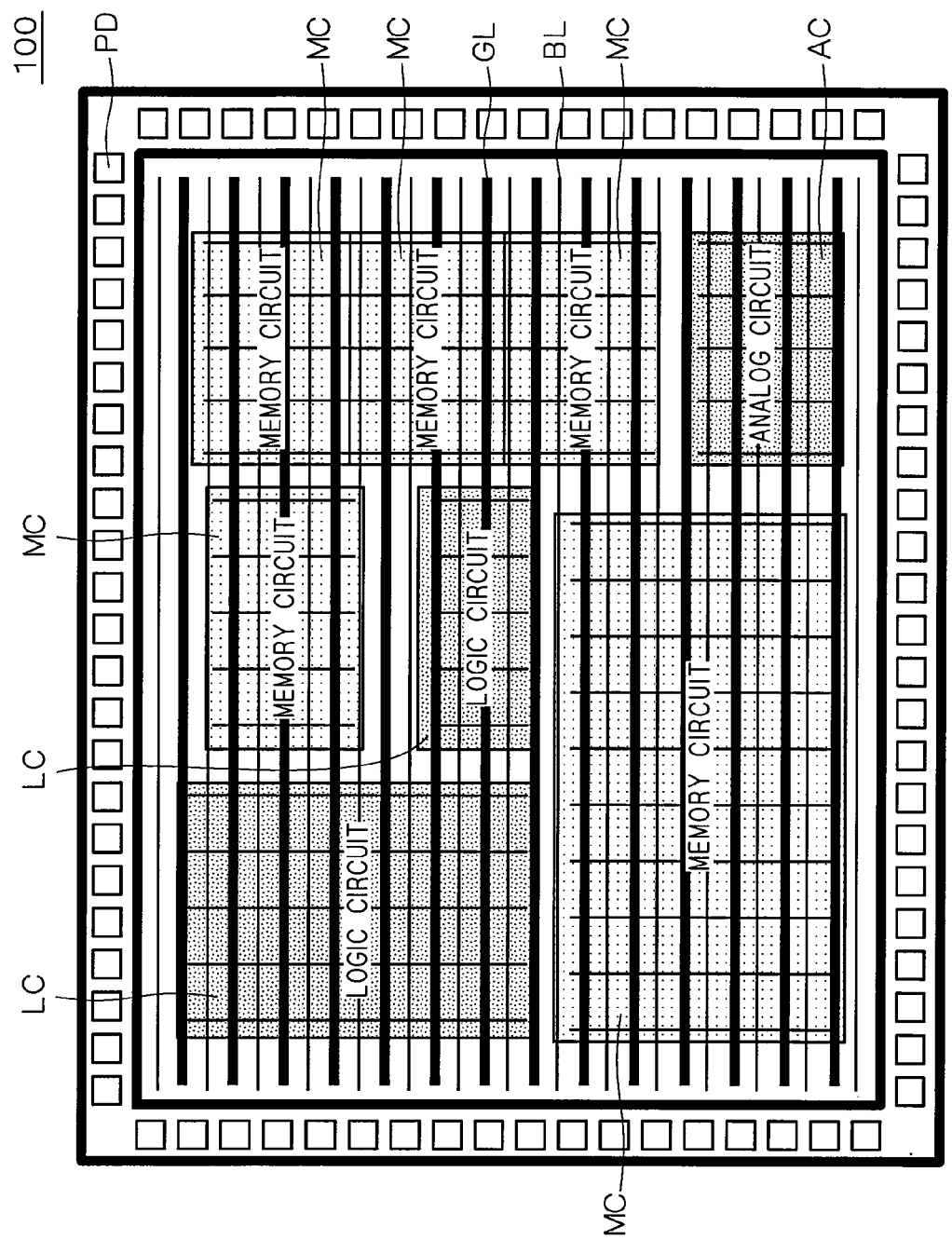
FIG. 1 is a block diagram showing a configuration of a semiconductor integrated circuit device according to a first embodiment of the present invention.

FIG. 1 is a view showing a layout in plan view of a semiconductor integrated circuit device 100 according to a first embodiment of the present invention.

As shown in FIG. 1, the semiconductor integrated circuit device 100 includes a plurality of logic circuits LC, an analog circuit AC, and a plurality of memory circuits MC, which are disposed on the same chip, and a plurality of pad electrodes PD are disposed along an edge of the chip so as to surround those. The plurality of pad electrodes PD are broadly classified into ones for supplying power supply voltage from the outside, ones for controlling body voltage, and ones which serve as a signal input portion.

The logic circuit LC is equipped with a central processing unit (CPU), various intellectual properties corresponding to uses such as image processing and network processing, while the analog circuit AC is equipped with an analog/digital converter, a digital/analog converter, an interface circuit, a phase/delay locked loop (PLL/DLL) and the like.

The memory circuit MC is disposed so as to be adjacent to the logic circuit LC, which holds data provided from the logic circuit LC and the like and also outputs the held data to the logic circuit LC and the like.

Further, a plurality of external power supply lines GL (including a grounding line) and body voltage control lines BL are alternately arranged in one direction so as to extend over the entire chip, which are configured to supply power and body voltage to the logic circuits LC, the analog circuit AC and the memory circuits MC.

Note that a body voltage control type logic gate which will be described below is fully applied in the logic circuit LC, while body voltage control type logic gate is partially applied in the memory circuit MC.

Figure 2:
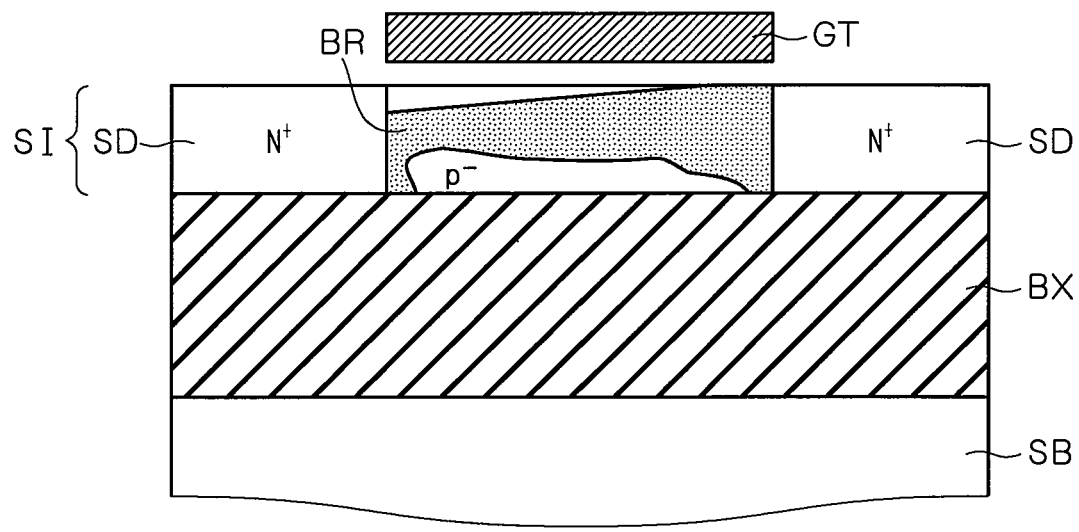
FIG. 2 is a cross-sectional view schematically showing an operating state of a partially-depleted transistor.
Figure 3:
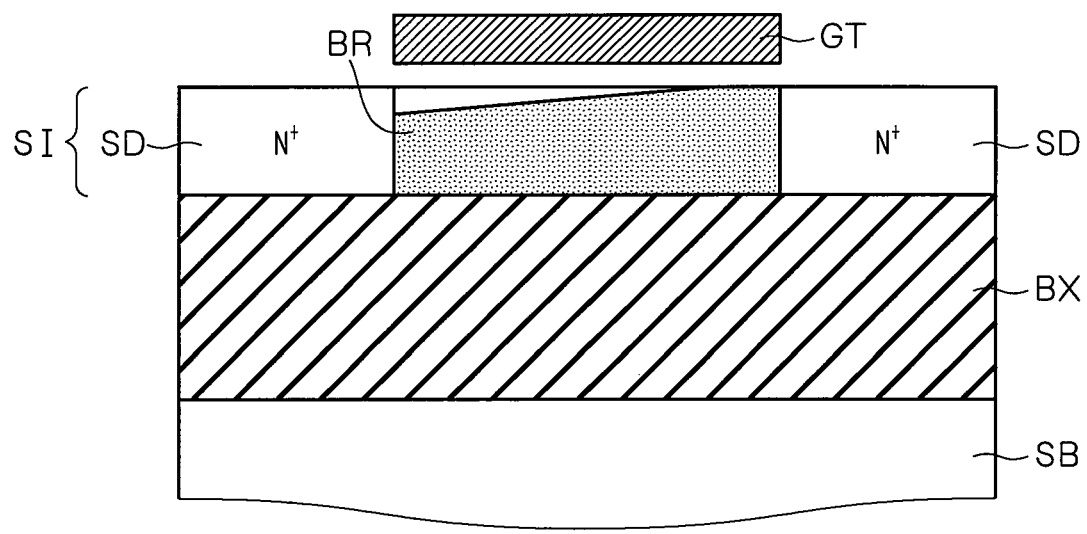
FIG. 3 is a cross-sectional view schematically showing an operating state of a fully-depleted transistor.

Next, with reference to cross-sectional views in a direction along a gate length, which are shown in FIG. 2 and FIG. 3, a partially-depleted transistor and a fully-depleted transistor will be described.

FIG. 2 schematically shows a state of a body BR, which is formed on an SOI substrate (a buried oxide film BX and an SOI layer SI are laminated on a silicon substrate SB in order), during operation of an N-channel partially-depleted transistor, and there is a characteristic that a region ($P^-$ region) which is not depleted remains in the deepest part of the SOI layer SI sandwiched between source/drain layers SD ($N^+$) in a case where a predetermined gate voltage is applied to a gate electrode GT.

On the other hand, FIG. 3 schematically shows a state of the body BR during operation of an N-channel fully-depleted transistor, which is formed on the SOI substrate, and there is a characteristic that the body BR is fully depleted when a predetermined gate voltage is applied to the gate electrode GT.

Figure 4:
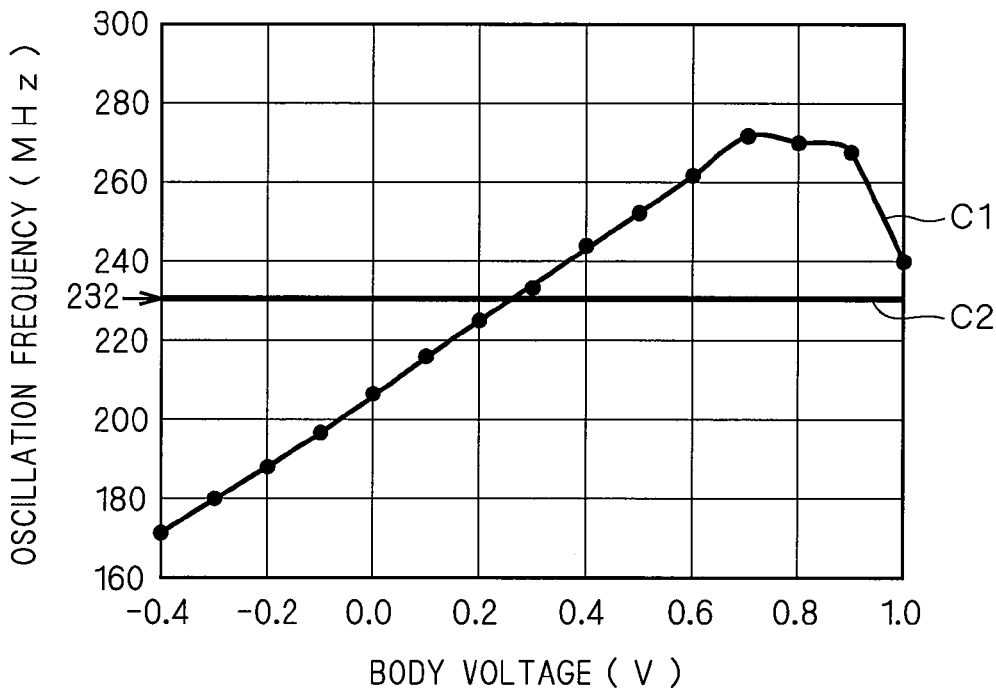
FIG. 4 is a figure showing simulation results of oscillator characteristics of a ring oscillator composed of inverters using the partially-depleted transistor and the fully-depleted transistor.

FIG. 4 shows simulation results of oscillator characteristics by individually using the N-channel partially-depleted transistors and fully-depleted transistors having the above-mentioned characteristics to form a ring oscillator composed of a plurality of inverters. Note that this simulation was performed by, in the above-mentioned two types of transistors, adding an electrode for body fixing to fix a body potential.

In FIG. 4, a horizontal axis represents a body voltage (V), a vertical axis represents an oscillation frequency (MHz), a characteristic C1 represents an oscillatior characteristic of the ring oscillator composed of the partially-depleted transistors, and a characteristic C2 represents an oscillator characteristic of the ring oscillator composed of the fully-depleted transistors.

As shown in FIG. 4, the body is fully depleted irrespective of the body voltage in the fully-depleted transistor, and thus a frequency characteristic of the oscillator hardly depends on the body voltage and the oscillation frequency is almost constant at 232 MHz.

In contrast to this, a semiconductor layer remains in the body of the partially-depleted transistor, whereby the body voltage is applied to the entire transistor through that region. For this reason, the oscillation frequency considerably depends on the body voltage, and as indicated by the characteristic C1, the oscillation frequency increases along with an increase in body voltage until the body voltage reaches 0.7 V.

Here, as to the characteristic C1, the oscillation frequency starts decreasing when the body voltage exceeds 0.7 V. This is because a diode is turned on between the body and the source/drain layers, whereby a forward current starts flowing from the $P^-$ region to an $N^+$ layer.

Typically when body fixing is performed, the body voltage is fixed to the ground level (0 V) in the case of the N-channel MOS transistor, and accordingly the oscillation frequency becomes lower compared with the fully-depleted transistor. However, FIG. 4 reveals that the oscillation frequency (operating speed) becomes higher compared with the fully-depleted transistor when the body voltage is increased to a positive voltage, and accordingly a characteristic thereof is reversed.

It is conceivable that in a case of the N-channel MOS transistor, this is because a threshold voltage of the transistor drops when a body voltage rises to a positive voltage, and thus current flowing between the source and the drain increases, and because a weak PN forward current flows from the body to the source, and thus characteristics of a bipolar element are started to be exhibited. Note that in a case of a P-channel MOS transistor, it is possible to increase an oscillation frequency (operating speed) by applying a voltage lower than a power supply voltage.

The inventor has arrived at a technical idea that transistors which change from a partially-depleted state to a fully-depleted state are used with the use of this characteristic, to thereby constitute a logic gate capable of keeping an operating speed even if an operating voltage is changed.

Figure 5:
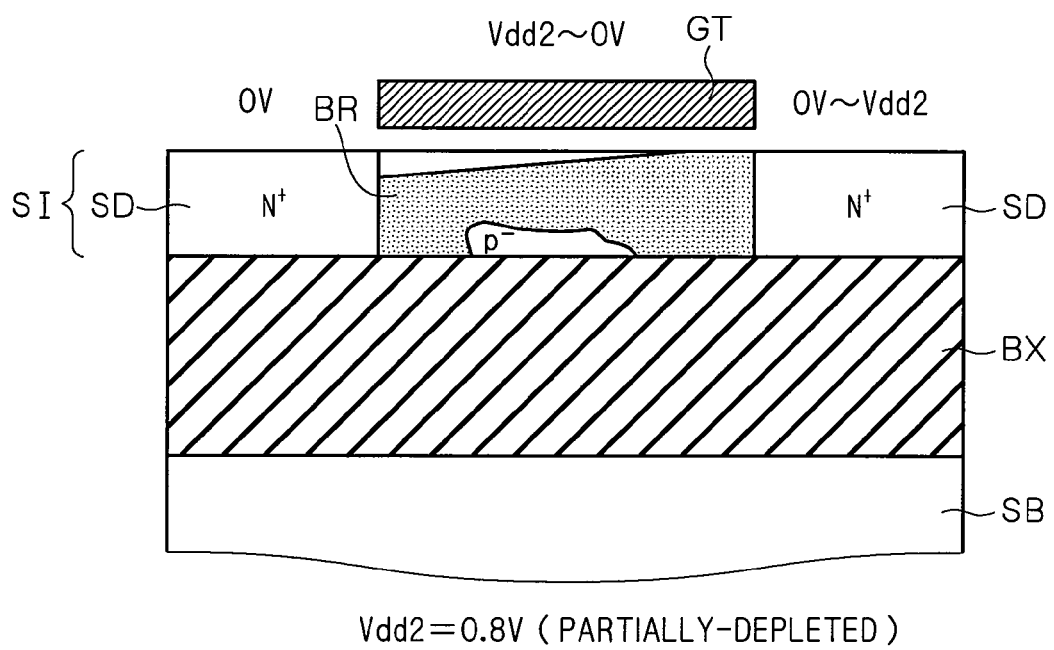
FIG. 5 is a view schematically showing a state in which a body changes from a partially-depleted state to a fully-depleted state when power supply voltage changes.
Figure 6:
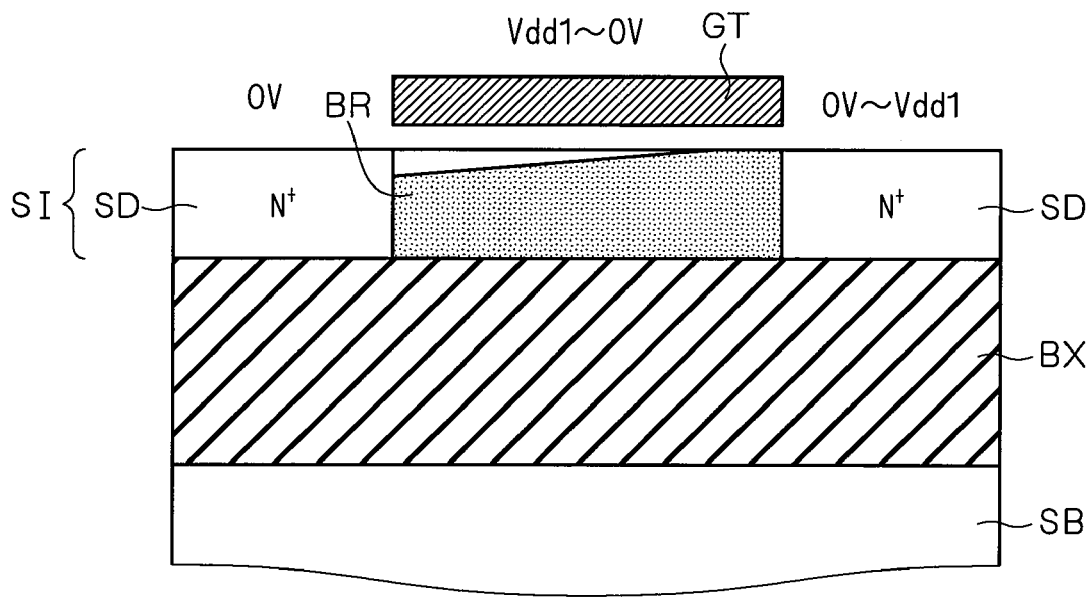
FIG. 6 is a view schematically showing a state in which the body changes from the partially-depleted state to the fully-depleted state when the power supply voltage changes.

FIG. 5 and FIG. 6 show a state in which the body changes from the partially-depleted state to the fully-depleted state when the power supply voltage changes. FIG. 5 schematically shows the body BR during operation of an N-channel MOS transistor in a case of a power supply voltage Vdd2 being 0.8 V. In a case where gate voltage within a range of 0 V to Vdd2 is applied to the gate electrode GT, a region ($P^-$ region) which is not depleted remains in the deepest part of the SOI layer SI, whereby the body BR is brought into the partially-depleted state. When the power supply voltage is low as described above, the depletion layer is difficult to spread, whereby a non-depletion region is formed in the deepest part of the body.

On the other hand, FIG. 6 schematically shows the body BR during operation of the N-channel MOS transistor in a case of a power supply voltage Vdd1 being 1.2 V. In a case where gate voltage within a range of 0 V to Vdd1 is applied to the gate electrode GT, the depletion layer spreads, whereby the body BR is brought into the fully-depleted state.

Figure 7:
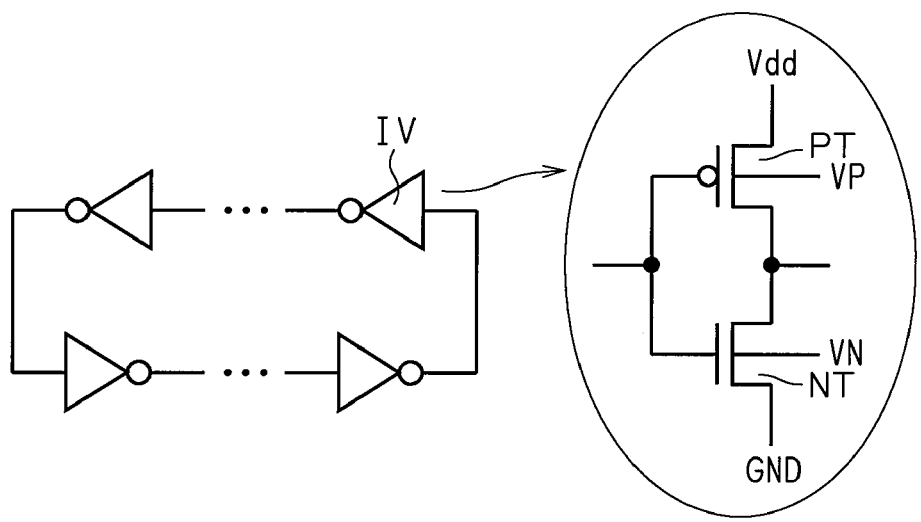
FIG. 7 is a diagram showing a configuration of a body control oscillator.

FIG. 7 shows a body control oscillator which is formed by using transistors whose body changes from the partially-depleted state to the fully-depleted state due to a change in power supply voltage so as to control the body voltage.

As shown in FIG. 7, the body control oscillator has a form of a ring oscillator in which a plurality of, for example, 101 inverters IV are connected in a ring shape, and each of the inverters IV is composed of a P-channel MOS transistor (PMOS transistor) and an N-channel MOS transistor (NMOS transistor) NT which are inverter-connected.

The PMOS transistor PT is configured so that a source thereof is supplied with a power supply voltage Vdd from the outside and a body thereof is fixed to a voltage VP, and the NMOS transistor NT is configured so that a source thereof is grounded (GND) and a body thereof is fixed to a voltage VN. Note that in the PMOS transistor PT and the NMOS transistor NT, a thickness of the SOI layer and a channel dose are set such that the body thereof changes from the partially-depleted state to the fully-depleted state by changing the power supply voltage.

As a specific example, polysilicon is used as a material for the gate electrode, N-type impurities are introduced into the gate electrode of the NMOS transistor NT, and P-type impurities are introduced into the gate electrode of the PMOS transistor PT. In a case where the thickness of the SOI layer is 100 nm and the thickness of the buried oxide film is 380 nm, it is possible to obtain the MOS transistors having the above-mentioned characteristics by setting the channel dose to $5\times10^{16}/cm^3$ to $1\times10^{17}/cm^3$. Note that under the above-mentioned conditions, in a case where the channel dose is less than $5\times10^{16}/cm^3$, the fully-depleted transistor is obtained, whereby a state change due to a change in power supply voltage cannot be obtained. On the other hand, in a case where the channel dose is more than $1\times10^{17}/cm^3$, the partially-depleted transistor is obtained, whereby a state change due to a change in power supply voltage cannot be obtained.

Figure 8:
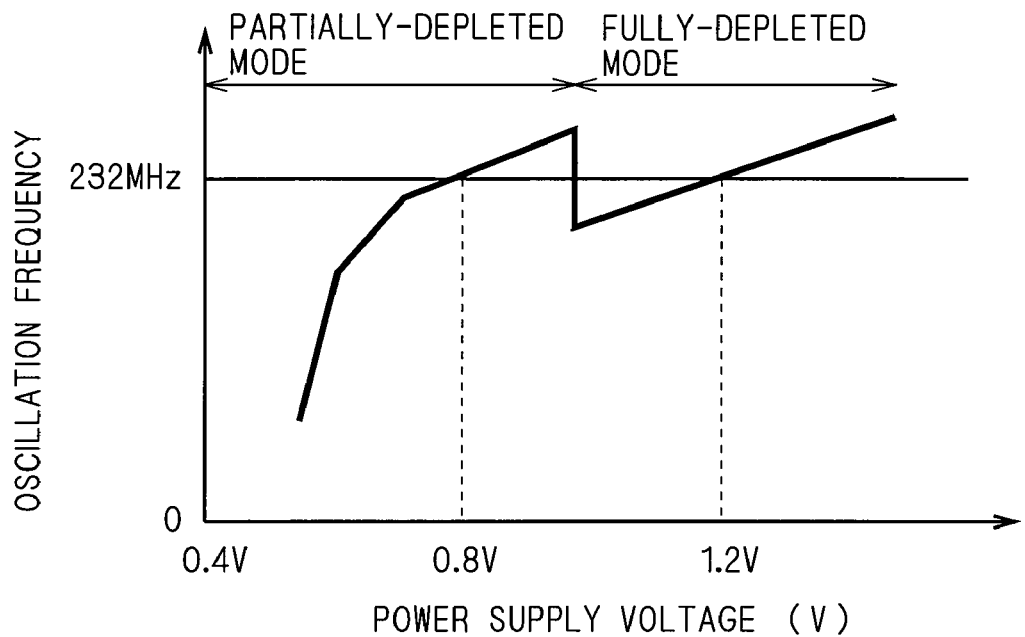
FIG. 8 is a figure showing simulation results of a frequency characteristic of the body control oscillator.

The body control oscillator having the configuration as described above is capable of achieving a frequency characteristic as shown in FIG. 8. That is, FIG. 8 shows simulation results, where a horizontal axis and a vertical axis represent a power supply voltage (V) and an oscillation frequency (MHz), respectively. With the power supply voltage of approximately 1 V being as a border, there is provided such a discontinuous characteristic that the partially-depleted mode is obtained at voltage lower than that and the fully-depleted mode is obtained at voltage higher than that.

In the partially-depleted mode, the oscillation frequency rapidly rises when the power supply voltage is between 0.5 V and 0.6 V, and reaches 232 MHz at 0.8 V. On this occasion, the body voltage VP is the power supply voltage (Vdd)–0.8 V, and the body voltage VN is set to 0.8 V.

The oscillation frequency rises if the power supply voltage is further raised, but it is brought into the fully-depleted mode when the power supply voltage is approximately 1 V, and the oscillation frequency temporarily falls below 232 MHz.

In the fully-depleted mode, the oscillation frequency is determined by the power supply voltage without being affected by a body potential, and when the power supply voltage reaches 1.2 V, the oscillation frequency reaches 232 MHz and then further increases.

As described above, when the MOS transistors in which the depletion state of the body changes in a discontinuous manner due to the change in power supply voltage are used, it is possible to obtain an oscillator in which there are two spots having the same frequency (232 MHz in the simulation of FIG. 8) irrespective of different power supply voltages.

This means that it is possible to achieve a logic gate capable of obtaining the same delay time with respect to two different power supply voltages, whereby it is possible to achieve power reduction by applying the body voltage control type logic gate as described above to the semiconductor integrated circuit device 100 shown in FIG. 1.

That is, the body voltage control type logic gate is fully applied in the logic circuit LC, and the body voltage control type logic gate is applied to a logic circuit (not shown) contained in the memory circuit MC, where the all operations are performed at 1.2 V during the normal operation, and the power supply voltage is reduced to 0.8 V in the preset operating state. Accordingly, it is possible to reduce power of the main logic circuits.

Here, the preset operating state refers to a case where, in a mobile device or the like, displaying on a display using a graphic memory is stopped but an application processing is continued inside thereof. Conventionally in such a case, though the memory circuit stops the processing such as a low-voltage data retention operation and a display operation, the logic circuit needs to continue operating as normal. However, as described with reference to FIG. 8, it is possible to achieve the logic gate capable of obtaining the same delay time if the power supply voltage is 1.2 V or 0.8 V by using the MOS transistor in which the depletion state of the body changes due to a change in power supply voltage. Accordingly, even in a case where a voltage supplied to the chip is equally lowered from 1.2 V to 0.8 V, it is possible to keep a low-voltage data retention operation in the memory circuit and execute an operation even in the logic circuit.

A specific configuration for body fixing is now described with reference to FIG. 9 to FIG. 12.

Figure 9:
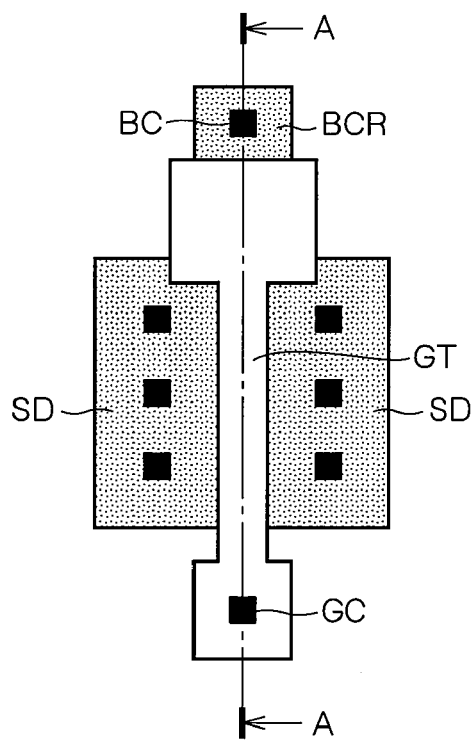
FIG. 9 is a plan view showing a specific example for body fixing of a MOS transistor.

FIG. 9 is a plan view of the MOS transistor when viewed from above the gate electrode GT, where the body is located in the region below the gate electrode GT sandwiched between the source/drain layers SD, and a part thereof extends up to an outside of one end of the gate electrode GT in a direction along a gate width to be exposed as a body contact region BCR. A body contact BC is connected to body contact region BCR, whereby the body potential is fixed.

Figure 10:
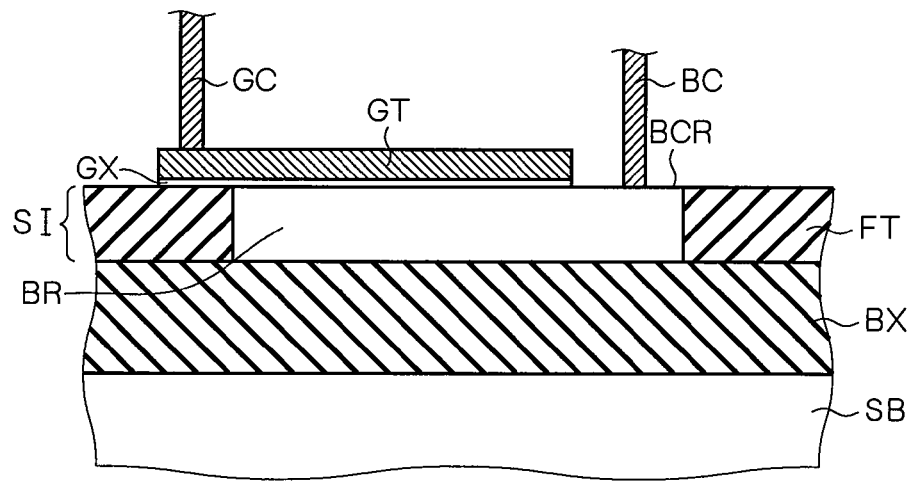
FIG. 10 is a cross-sectional view showing a specific example for the body fixing of the MOS transistor.

FIG. 10 shows a cross-sectional configuration taken along the A-A line shown in FIG. 9.

As shown in FIG. 10, an active region of the SOI layer SI on the buried oxide film BX of the SOI substrate is defined by a trench isolation film FT, and the source/drain layers SD and the body BR are formed in the active region. The gate electrode GT is disposed on the body BR through a gate insulating film GX, and the gate electrode GT is supplied with a control voltage through a gate contact GC.

Figure 11:
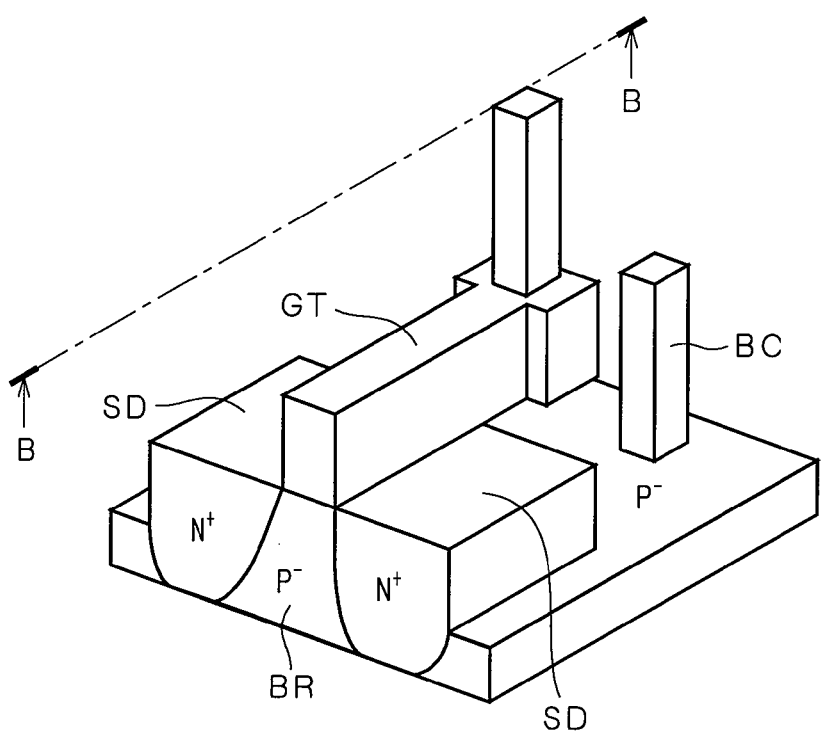
FIG. 11 is a perspective view showing a specific example for the body fixing of the MOS transistor.

FIG. 11 is a perspective view showing other configuration example for body fixing. Although FIG. 11 is the same as the case of FIG. 9 in that the body BR is located in the region sandwiched between the source/drain layers SD, which is directly below the gate electrode GT, the body BR not only extends to the outside of the one end of the gate electrode GT in the direction along the gate width but also extends so as to surround the source/drain layers SD. This part becomes the body contact region BCR, and the body contact BC is connected to the body contact region BCR, whereby it is possible to fix the body potential.

Figure 12:
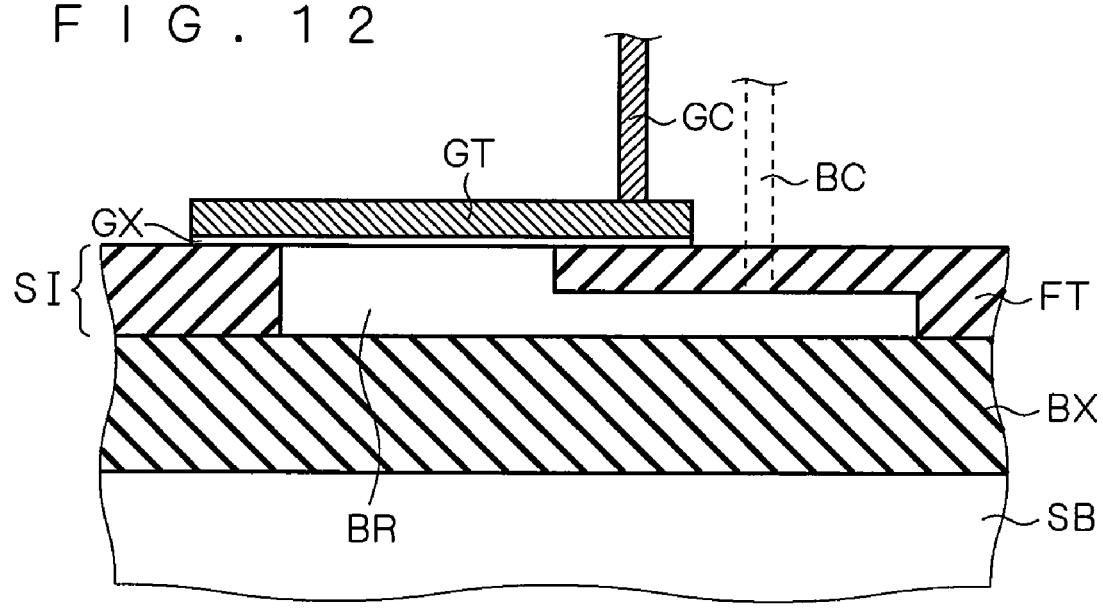
FIG. 12 is a cross-sectional view showing a specific example for the body fixing of the MOS transistor.

FIG. 12 shows a cross-sectional configuration taken along the B-B line shown in FIG. 11.

As shown in FIG. 12, the active region of the SOI layer SI on the buried oxide film BX of the SOI substrate is defined by the trench isolation film FT, which has a configuration in which the body contact region BCR is not exposed because the trench isolation film FT is located in the outside of the one end of the gate electrode GT in the direction along the gate width and also above the body contact region BCR around the source/drain layers SD. The body contact BC is configured to penetrate through the trench isolation film FT to be connected to the body contact region BCR.

As described above, it is possible to, in the SOI device whose body may be the SOI layer SI of the SOI substrate, electrically separate the body from the semiconductor substrate, which is a structure suitable for appropriately setting a body potential.

B. Second Embodiment

Figure 13:
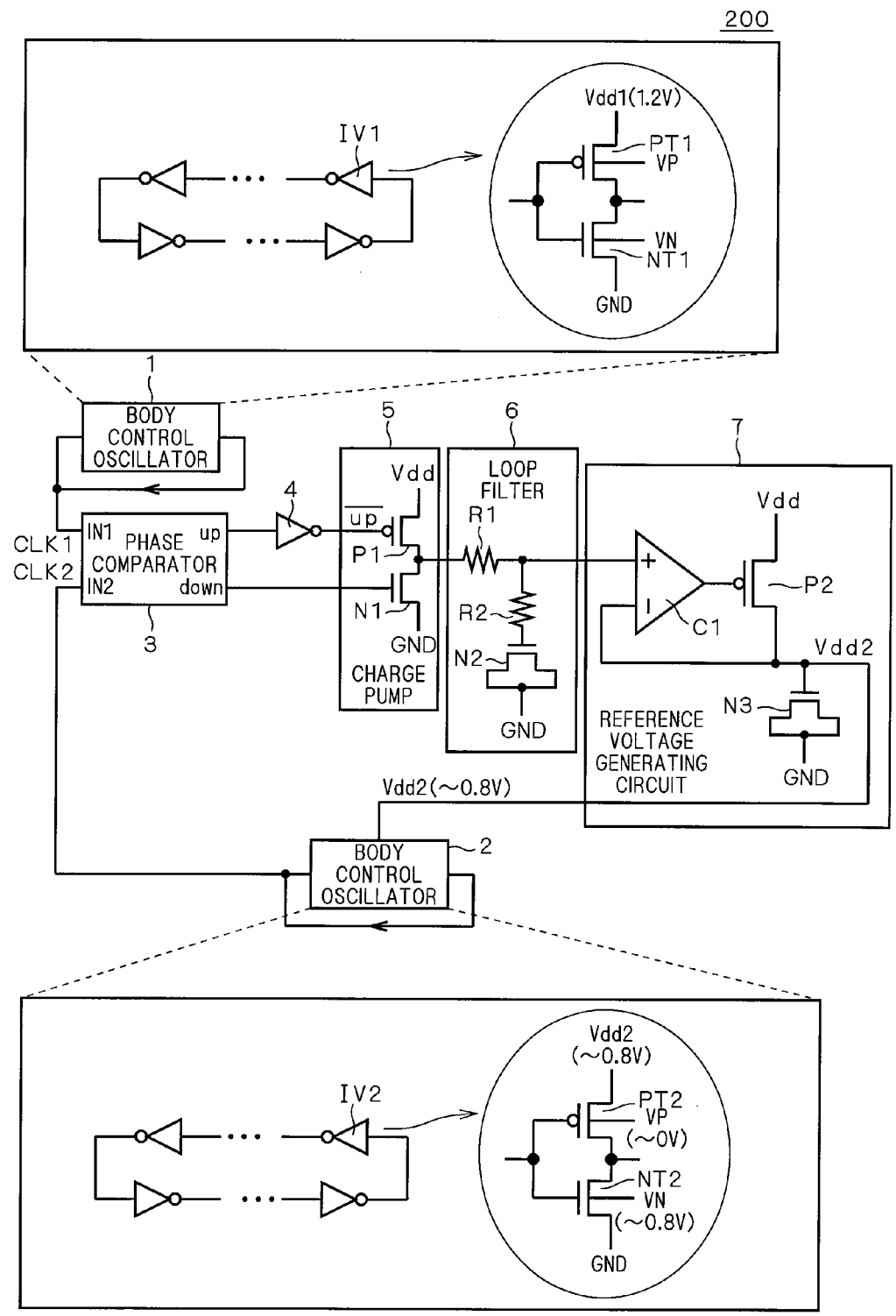
FIG. 13 is a block diagram showing a configuration of a self-correcting reference voltage generating circuit according to a second embodiment of the present invention.

FIG. 13 is a block diagram showing a configuration of a self-correcting reference voltage generating circuit 200 according to a second embodiment of the present invention.

The self-correcting reference voltage generating circuit 200 mainly includes body control oscillators 1 and 2, a phase comparator 3, a charge pump 5, a loop filter 6 and a reference voltage generating circuit 7 (correction circuit), and the phase comparator 3, the charge pump 5 and the loop filter 6 constitute a so-called phase-locked loop (PLL) circuit.

Outputs of the body control oscillators 1 and 2 are respectively fed back to inputs thereof, and are also input to input portions IN1 and IN2 of the phase comparator 3 as internal oscillation clocks CLK1 and CLK2, respectively. The phase comparator 3 compares phases thereof and, in a case where there is a gap therebetween, outputs an up signal (up) and a down signal (down) as pulse signals for eliminating the gap.

The charge pump 5 has a configuration in which a PMOS transistor P1 which receives the power supply voltage Vdd by a source thereof and an NMOS transistor N1 whose source is grounded (GND) are connected in series, and a connection node between two transistors serves as an output portion. The charge pump 5 has a function of supplying the power supply voltage Vdd to the output portion or a constant current from GND during only a period during which input signals are activated.

The up signal output from the phase comparator 3 is supplied as an inverted up signal (bar up) to a gate of the PMOS transistor P1 of the charge pump 5 through the inverter 4, whereas the down signal is supplied to a gate of the NMOS transistor N1 of the charge pump 5.

The loop filter 6 includes a resistive element R1 whose one end is connected to the output portion of the charge pump 5, a resistive element R2 whose one end is connected to the other end of the resistive element R1, and a depletion-type NMOS transistor N2 whose gate is connected to the other end of the resistive element R2, and a connection node between the resistive elements R1 and R2 serves as an output portion. The loop filter 6 uses a gate capacitance of the NMOS transistor N2 in place of a capacitor, and accumulates and emits charges in accordance with an output of the charge pump 5, thereby generating an output signal to the reference voltage generating circuit 7.

The reference voltage generating circuit 7 includes a comparator C1 whose + terminal is connected with the output portion of the loop filter 6, a PMOS transistor P2 having a source supplied with the power supply voltage Vdd (which is a voltage higher than Vdd2 described below) and a gate controlled by an output of the comparator C1, and a depletion-type NMOS transistor N3 whose gate is connected to a drain of the PMOS transistor P2. A drain voltage of the PMOS transistor P2 is supplied to the body control oscillator 2 as a reference voltage Vdd2 and is also supplied to a − terminal of the comparator C1. A gate capacitance of the NMOS transistor N3 is used as a capacitor.

The body control oscillator 1 has a form of a ring oscillator in which a plurality of, for example, 101 inverters IV1 are connected in a ring shape. Each of the inverters IV1 is composed of a PMOS transistor PT1 and an NMOS transistor NT1 which are inverter-connected, where a source of the PMOS transistor PT1 is supplied with the power supply voltage Vdd1 and a body thereof is fixed to the voltage VP. The NMOS transistor NT1 is configured so that a source thereof is grounded (GND) and a body thereof is fixed to the voltage VN. Note that in the PMOS transistor PT1 and the NMOS transistor NT1, a thickness of the SOI layer and a channel dose are set such that the body changes from the partially-depleted state to the fully-depleted state by changing the power supply voltage, and in this case, the power supply voltage Vdd1 is set to 1.2 V so as to obtain the fully-depleted mode, whereby the PMOS transistor PT1 as well as the NMOS transistor NT1 do not depend on the body voltage.

The body control oscillator 2 has a form of a ring oscillator in which a plurality of, for example, 101 inverters IV2 are connected in a ring shape. Each of the inverters IV2 is composed of a PMOS transistor PT2 and an NMOS transistor NT2 which are inverter-connected, where a source of the PMOS transistor PT2 is supplied with the reference voltage Vdd2 and a body thereof is fixed to the voltage VP. The NMOS transistor NT2 is configured so that a source thereof is grounded (GND) and a body thereof is fixed to the voltage VN. Note that the power supply voltage Vdd1 of the body control oscillator 1 is supplied from the outside of the chip.

In the PMOS transistor PT2 and the NMOS transistor NT2, a thickness of the SOI layer and a channel dose are set such that the body changes from the partially-depleted state to the fully-depleted state by changing the power supply voltage. In this case, the reference voltage Vdd2 is set to 0.8 V, the body voltage VP of the PMOS transistor PT2 is set to 0 V, and the body voltage VN of the NMOS transistor NT2 is set to 0.8 V so as to obtain the partially-depleted mode.

In the self-correcting reference voltage generating circuit 200 having the configuration as described above, the up signal or the down signal is output from the phase comparator 3 when the reference voltage Vdd2 changes and then a phase of the internal oscillation clock CLK2, which is output from the body control oscillator 2, changes. For example, in a case where the phase of the internal oscillation clock CLK2 is delayed, the phase comparator 3 outputs the up signal, which then becomes an inverted up signal by the inverter 4 to be activated, whereby the PMOS transistor P1 of the charge pump 5 is turned on during that period. Accordingly, the power supply current flows into the loop filter 6 through the PMOS transistor P1, whereby the NMOS transistor N2 serving as a capacitor is charged to increase an output voltage. It is possible to convert information on phase gap into a voltage value (charge amount) to be accumulated by using those circuits, but the charge amount charged in this case is a signal which has a small absolute amount and extremely low driving performance (high output impedance). Accordingly, the configuration is made such that a voltage value corresponding to the accumulated information is output as the reference voltage Vdd2 having relatively low impedance by using the reference voltage generating circuit 7.

The comparator C1 of the reference voltage generating circuit 7 compares the reference voltage Vdd2 with the output voltage of the loop filter 6, and outputs a control signal so that the PMOS transistor P2 is turned on during a period during which the reference voltage Vdd2 is lower.

When the PMOS transistor P2 is turned on, the reference voltage Vdd2 rises to a preset value, 0.8 V in this case. When the reference voltage Vdd2 reaches 0.8 V, the phase of the internal oscillation clock CLK2, which is output from the body control oscillator 2, becomes equal to the phase of the internal oscillation clock CLK1, which is output from the body control oscillator 1, whereby the phase comparator 3 stops outputting the up signal.

In contrast, in a case where the phase of the internal oscillation clock CLK2 is advanced, the phase comparator 3 outputs the down signal and operates so as to lower the value of the reference voltage Vdd2.

As described above, the self-correcting reference voltage generating circuit 200 makes self-correction such that the reference voltage Vdd2 is kept at 0.8 V, and thus is capable of providing the stable reference voltage Vdd2. Accordingly, it is possible to obtain the internal oscillation clocks CLK1 and CLK2 having an identical phase.

In a circuit composed of a plurality of inverters as the body control oscillators 1 and 2, there is no guarantee that operation is performed at exactly the same frequency due to process variations. In order to make correction by absorbing the process variations, it is an extremely effective technique to employ the self-correcting reference voltage generating circuit 200.

Note that in the semiconductor integrated circuit device 100 shown in FIG. 1, the self-correcting reference voltage generating circuit 200 is provided in an internal voltage generating circuit (not shown) disposed in a vicinity of each logic circuit LC or memory circuit MC. In the internal voltage generating circuit, there is provided a circuit which generates the power supply voltage Vdd2 supplied to an actual load based on the reference voltage Vdd2 generated by the self-correcting reference voltage generating circuit 200, and the power supply voltage Vdd2 is generated based on the corrected reference voltage Vdd2.

In order to make the operating frequencies coincide with each other in the fully-depleted mode and the partially-depleted mode, accuracy of the power supply voltage of the logic gate operating in the partially-depleted mode is important. In the self-correcting reference voltage generating circuit 200, the reference voltage Vdd2 is corrected so that an oscillation frequency of the body control oscillator 2 and an oscillation frequency of the body control oscillator 1 coincide with each other, whereby it is possible to obtain the highly accurate power supply voltage Vdd2.

If the logic gate formed in exactly the same manner as the inverters IV1 and IV2 constituting the body control oscillators 1 and 2, respectively, is used in the logic circuit LC or the like of the semiconductor integrated circuit device 100, the logic gate is brought into the fully-depleted mode in a case of the power supply voltage of 1.2 V. Therefore, if the oscillation frequency is, for example, 232 MHz, it is possible to obtain a logic gate in which delay time per stage is 4 nsec/100=40 psec.

The partially-depleted mode is obtained in a case where the power supply voltage is 0.8 V, the body voltage VP is 0 V, and the body voltage VN is 0.8 V, and also in this case, it is possible to obtain a logic gate in which delay time per stage is 40 psec.

As described above, if the self-correcting reference voltage generating circuit 200 is used, the power supply voltage Vdd2 for achieving the partially-depleted mode is obtained with high accuracy. Therefore, it is possible to obtain a semiconductor integrated circuit device having the same operating frequency even in a case where different power supply voltages are applied thereto.

C. Third Embodiment

Figure 14:
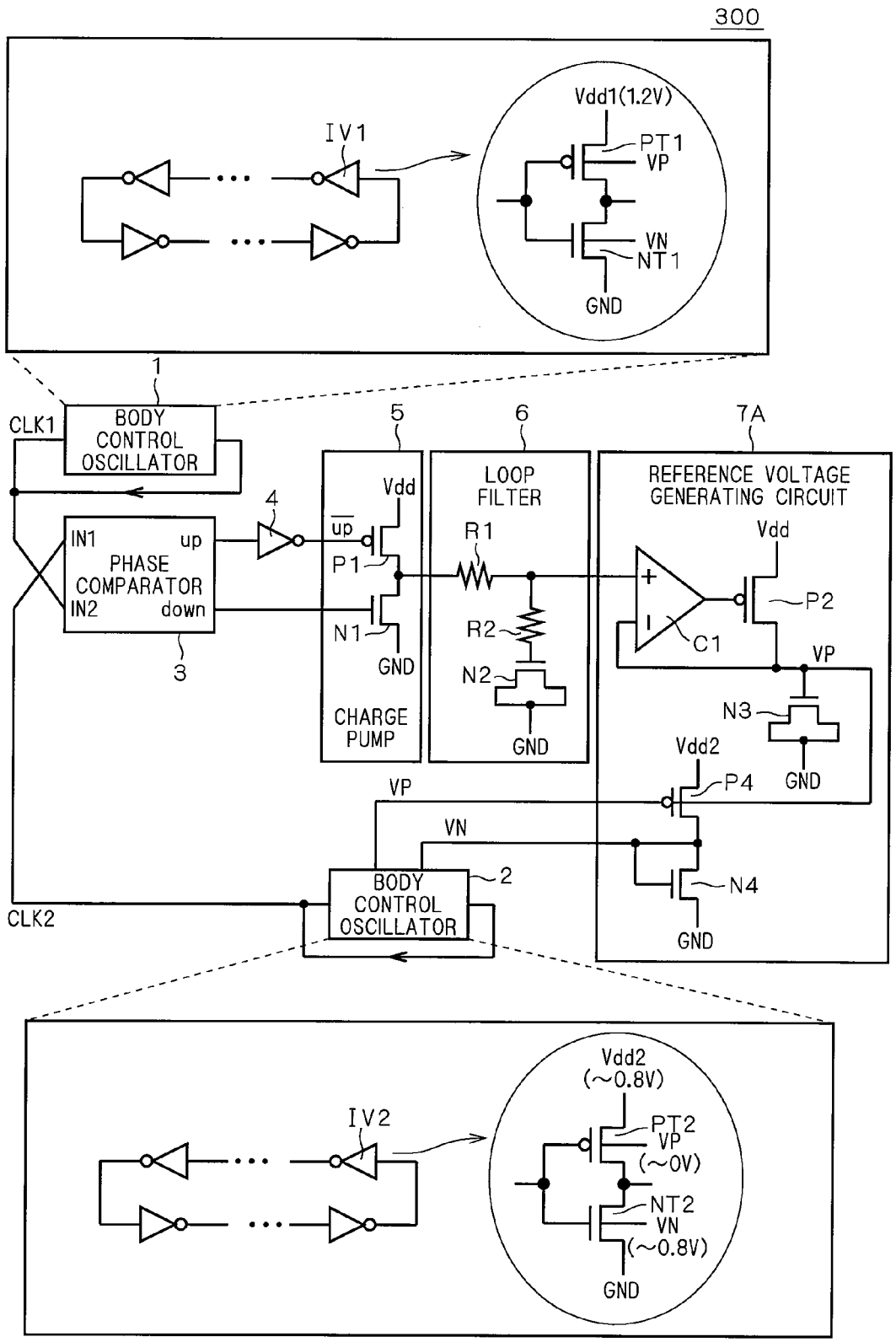
FIG. 14 is a block diagram showing a configuration of a self-correcting reference voltage generating circuit according to a third embodiment of the present invention.

FIG. 14 is a block diagram showing a configuration of a self-correcting reference voltage generating circuit 300 according to a third embodiment of the present invention. Note that the same configurations as those of the self-correcting reference voltage generating circuit 200 shown in FIG. 13 are denoted by the same reference symbols, and overlapping description will be omitted.

The self-correcting reference voltage generating circuit 300 compares the phases of the internal oscillation clocks CLK 1 and CLK2, which are output from the body control oscillators 1 and 2, respectively, by the phase comparator 3 and, in a case where there is the gap between the phases thereof, performs an operation to output an up signal and a down signal for eliminating the gap as a pulse signal correct the reference voltages VP and VN corresponding to the body control voltage by a reference voltage generating circuit 7A (correction circuit) to supply them to the body control oscillator 2, and adjust the phase of the body control oscillator 2 so as to coincide with the phase of the body control oscillator 1.

The configuration of the phase comparator 3 is the same as that of the self-correcting reference voltage generating circuit 200, but is different from the self-correcting reference voltage generating circuit 200 in that the internal oscillation clock CLK2 output from the body control oscillator 2 is supplied to the input portion IN1 and that the internal oscillation clock CLK1 output from the body control oscillator 1 is supplied to the input portion IN2. Note that the power supply voltages Vdd1 and Vdd2 of the body control oscillators 1 and 2, respectively, are supplied from the outside of the chip.

The reference voltage generating circuit 7A includes the comparator C1 whose + terminal is connected with the output portion of the loop filter 6, a PMOS transistor P2 which has a source supplied with the power supply voltage Vdd (which may be equal to Vdd2) and a gate controlled by an output of the comparator C1, a depletion-type NMOS transistor N3 whose gate is connected to a drain of the PMOS transistor P2, a PMOS transistor P4 which receives the power supply voltage Vdd2 by a source thereof, and an NMOS transistor N4 which has a source grounded (GND) and is connected in series with the PMOS transistor P4.

A drain voltage of the PMOS transistor P2 is supplied to the body control oscillator 2 as the reference voltage VP, and is also supplied to the – terminal of the comparator C1 and a gate of the PMOS transistor P4.

Further, the gate of the NMOS transistor N4 is connected to a connection node between the PMOS transistor P4 and itself, and a voltage of the connection node is supplied to the body control oscillator 2 as the reference voltage VN.

In the self-correcting reference voltage generating circuit 300 having the configuration as described above, the power supply voltage Vdd2 which is supplied from the outside changes, and then the phase of the internal oscillation clock CLK2, which is output from the body control oscillator 2, changes, whereby the phase comparator 3 outputs the up signal or the down signal. For example, in a case where the phase of the internal oscillation clock CLK2 is delayed, the phase comparator 3 outputs the down signal, and turns on the NMOS transistor N1 of the charge pump 5 during a period during which the down signal is supplied. Accordingly, charges are discharged from the NMOS transistor N2 serving as a capacitor through the NMOS transistor N1, whereby the output voltage drops.

When the output voltage of the charge pump 5 drops, the comparator C1 of the reference voltage generating circuit 7A performs a comparison with the reference voltage VP, and outputs a control signal such that the PMOS transistor P2 is turned off during a period during which the reference voltage VP is higher.

The reference voltage VP drops when the PMOS transistor P2 is turned off and is supplied to the internal oscillation clock CLK2.

The PMOS transistor P4 is turned on when the reference voltage VP drops, and the drain voltage of the PMOS transistor P4 rises, which is supplied to the internal oscillation clock CLK2 as the reference voltage VN.

In the PMOS transistor PT2 of the inverters IV2 constituting the body control oscillator 2, an operating speed increases when the reference voltage VP supplied as the body voltage drops. In the NMOS transistor NT2, the operating speed increases when the reference voltage VN supplied as the body voltage rises, which increases the operation of the inverter IV2. Then, the oscillation frequency of the body control oscillator 2 finally increases, and the phase of the internal oscillation clock CLK2, which is output from the body control oscillator 2, becomes equal to the phase of the internal oscillation clock CLK1, which is output from the body control oscillator 1, with the result that the phase comparator 3 stops outputting the down signal. On the other hand, in a case where the phase of the internal oscillation clock CLK2 is advanced, the phase comparator 3 outputs the up signal and operates so as to increase a value of the reference voltage VP.

The self-correcting reference voltage generating circuit 200 shown in FIG. 13 is configured so as to make self-correction by controlling the reference voltage Vdd2 corresponding to the power supply voltage of the body control oscillator 2 but, in this case, there arises a need to generate, based on the reference voltage Vdd2, the power supply voltage Vdd2 for causing the actual logic gate to operate in the partially-depleted mode. For that purpose, there is required an internal power supply voltage generating circuit having a current driving ability for driving the entire logic circuits of the chip.

In that case, considering the power efficiency and a ratio of an area occupied by the internal power supply voltage generating circuit within the chip, the power supply voltage is desirably supplied from the outside of the chip. If there are variations in the power supply voltage which is supplied externally (for example, 1.2 V and 0.8 V), there arises no problem when adjustment can be made internally.

The self-correcting reference voltage generating circuit 300 is capable of meeting such a demand, in which the reference voltage generating circuit 7A generates the reference voltages VP and VN corresponding to the body voltages VP (body voltage of the PMOS transistor) and VN (body voltage of the NMOS transistor), respectively, and corrects voltage values of the reference voltages VP and VN so that the phase of the body control oscillator 2 coincides with the phase of the body control oscillator 1. Accordingly, if when there occur variations in the power supply voltages Vdd1 and Vdd2 which are supplied from the outside of the chip, the reference voltages VP and VN are corrected to adjust the oscillation frequency.

In a case of employing a system of correcting the body voltage in this manner, the reference voltage generating circuit 7A can be formed in an extremely compact manner because current consumption is smaller in the body voltage compared with the power supply voltage. In addition, reduction in power consumption can be achieved sufficiently because a small power driving ability is required for the internal voltage generating circuit which generates the body voltages VP and VN based on the reference voltages VP and VN.

FIG. 15 shows a configuration example of the phase comparator 3.

As shown in FIG. 15, input signals supplied to input portions IN1 and IN2 are inverted by inverters G1 and G2, respectively. An output of the inverter G1 is input to a NAND circuit G3, and an output of the NAND circuit G3 is input to an inverter G9, a NAND circuit G4 and a four-input NAND circuit G10.

An output of the inverter G9 is input to an inverter G12, and an output of the inverter G12 is input to a three-input NAND circuit G14. An output of the NAND circuit G14 is supplied to an inverter G16 and is also fed back to the NAND circuit G3. Then, an output of the inverter G16 becomes an up signal.

An output of the NAND circuit G4 is input to the NAND circuit G10 and the NAND circuit G14 and is also input to a NAND circuit G5, and an output of the NAND circuit G5 is input to the NAND circuit G4. An output of the NAND circuit G10 is input to the NAND circuit G14 and is also input to the NAND circuit G5.

An output of the inverter G2 is input to a NAND circuit G8, and an output of the NAND circuit G8 is input to an inverter G11, a NAND circuit G7 and the NAND circuit G10.

An output of the inverter G11 is input to an inverter G13, and an output of the inverter G13 is input to a three-input NAND circuit G15. An output of the NAND circuit G15 is supplied to an inverter G17 and is also fed back to the NAND circuit G8. Then, an output of the inverter G17 becomes a down signal.

An output of the NAND circuit G7 is input to the NAND circuit G10 and the NAND circuit G15 and is also input to the NAND circuit G6, and an output of the NAND circuit G6 is input to the NAND circuit G7. An output of the NAND circuit G10 is input to the NAND circuit G14 and is also input to the NAND circuit G6. Note that the output of the NAND circuit G10 is input to the NAND circuit G6 and is also input to the NAND circuit G15.

D. First Modification

The first to third embodiments above describe the configuration in which MOS transistors constituting a logic gate are configured such that a depletion state of the body changes due to a change in power supply voltage, and an operating speed is controlled by controlling body potential of the MOS transistors. However, there may be employed a gate-body-directly-connected structure in which the body is connected to the gate.

Figure 16:
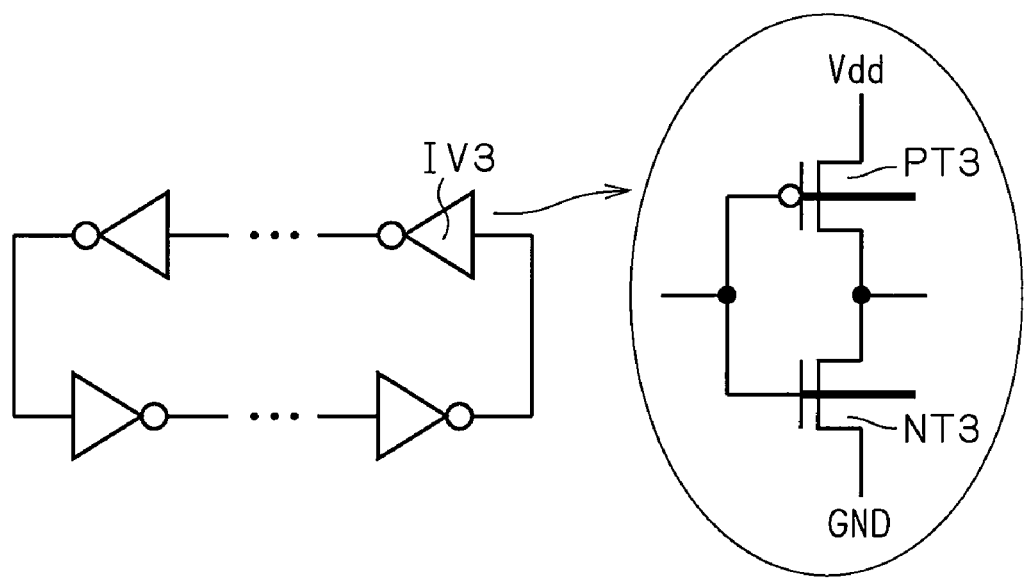
FIG. 16 is a diagram showing a configuration of a body control oscillator composed of gate-body-directly-connected transistors.

FIG. 16 shows a ring oscillator composed of MOS transistors having the gate-body-directly-connected structure.

As shown in FIG. 16, each of a plurality of inverters IV3 constituting the ring oscillator is composed of a PMOS transistor PT3 and an NMOS transistor NT3 which are inverter-connected, where configuration is made such that a power supply voltage Vdd is supplied to a source of the PMOS transistor PT3, a body thereof is directly connected to a gate thereof, a source of the NMOS transistor NT3 is grounded (GND), and a body thereof is directly connected to a gate thereof. Note that in the PMOS transistor PT3 and the NMOS transistor NT3, a thickness of the SOI layer and a channel dose are set so that the body changes from the partially-depleted state to the fully-depleted state when the power supply voltage is changed.

Figure 17:
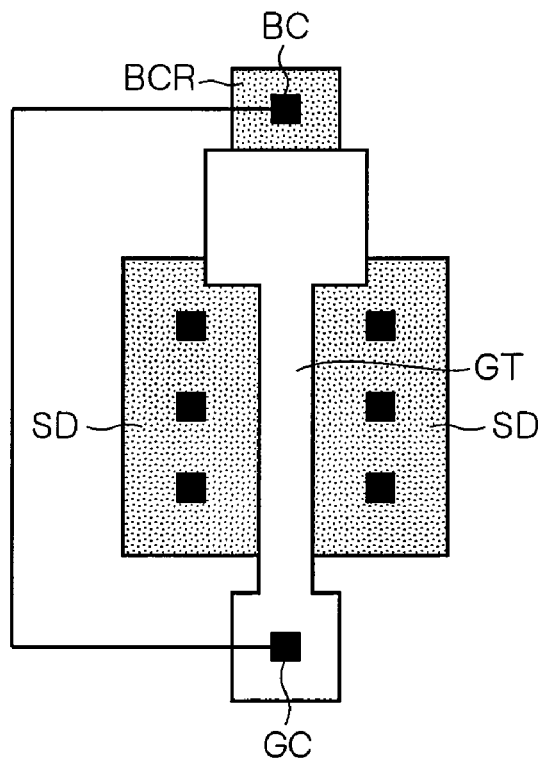
FIG. 17 is a plan view showing a specific example for connecting a gate and a body of the MOS transistor.
Figure 18:
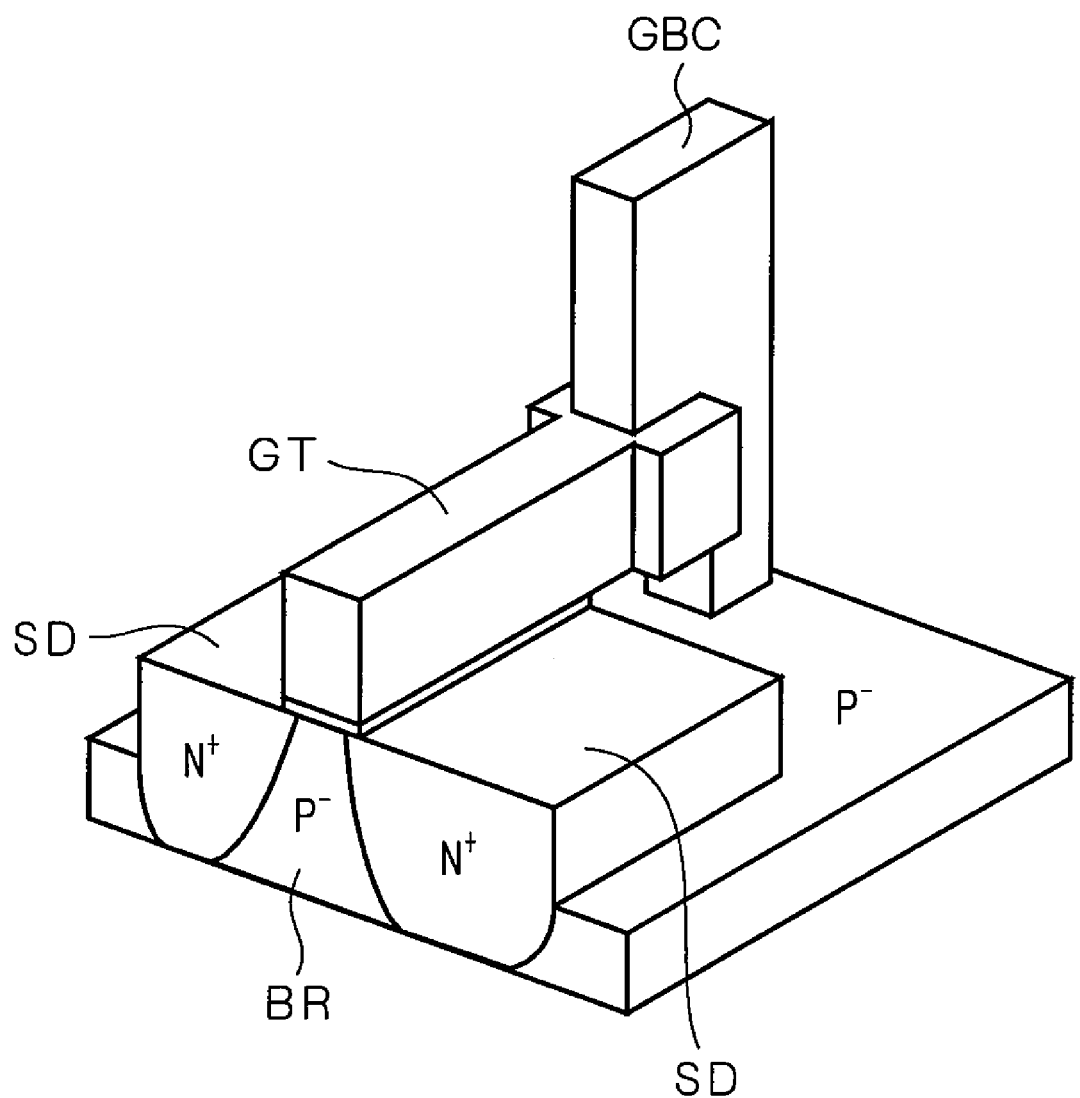
FIG. 18 is a perspective view showing a specific example for connecting the gate and the body of the MOS transistor.

FIG. 17 and FIG. 18 show a configuration example of the gate-body-directly-connected structure.

FIG. 17 is a plan view of the MOS transistor when viewed from above the gate electrode GT, in which the body is located in the region below the gate electrode GT sandwiched between the source/drain layers SD, and a part thereof extends up to an outside of one end of the gate electrode GT in a direction along a gate width to be exposed as the body contact region BCR. The body contact BC is connected to the body contact region BCR and is connected to the gate contact GC connected to the gate electrode GT, whereby the gate and the body are electrically connected to each other.

FIG. 18 is a perspective view showing the other configuration example for body fixing, which is the same as the case of FIG. 17 in that the body BR is located in the region sandwiched between the source/drain layers SD below the gate electrode GT. However, the body BR not only extends to the outside of one end of the gate electrode GT in the direction along the gate width but also extends so as to surround the source/drain layers SD. This part becomes the body contact region BCR. One end of the gate electrode GT in the direction along the gate width extends above the body contact region BCR through the intermediation of a trench isolation film (not shown). Accordingly, it is possible to electrically connect the gate and the body to each other by forming a gate-body-directly-connected contact GBC which penetrates through the end in a thickness direction and further penetrates through the trench isolation film to reach the body contact region BCR.

Figure 19:
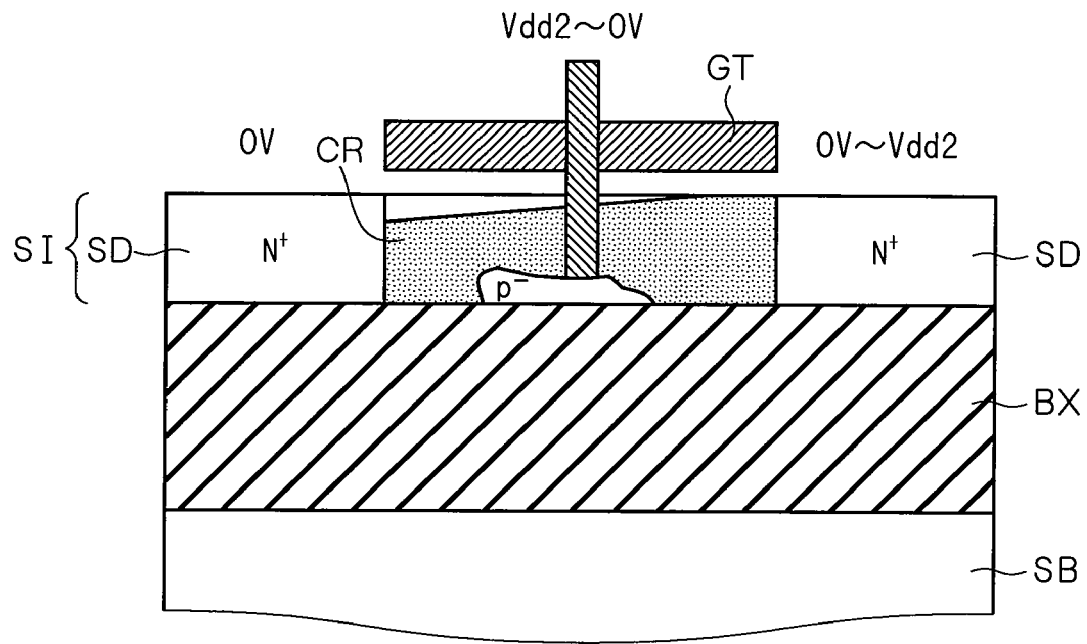
FIG. 19 is a view schematically showing a state in which the body of the MOS transistor having a gate-body-directly-connected structure changes from a partially-depleted state to a fully-depleted state when power supply voltage changes.
Figure 20:
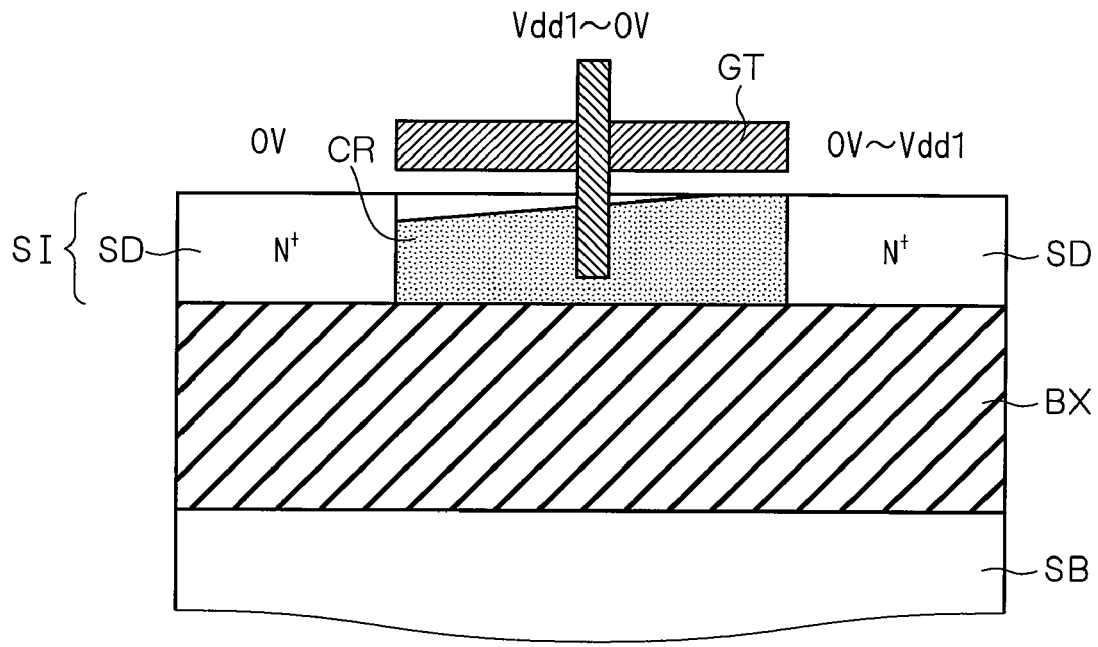
FIG. 20 is a view schematically showing a state in which the body of the MOS transistor having the gate-body-directly-connected structure changes from the partially-depleted state to the fully-depleted state when the power supply voltage changes.

FIG. 19 and FIG. 20 schematically show a state in which the body changes from the partially-depleted state to the fully-depleted state due to a change in power supply voltage in a case of the gate-body-directly-connected structure. FIG. 19 schematically shows the body BR during operation of an N-channel MOS transistor in a case where the power supply voltage Vdd2=0.5 V, where in a case in which gate voltage within a range of 0 V to Vdd2 is applied to the gate electrode GT, there remains a region (P⁻ region) which is not depleted in the deepest part of the SOI layer SI, and the body BR is brought into the partially-depleted state. It is revealed that the N-channel MOS transistor operates at lower power supply voltage compared with the case of body fixing which has been described with reference to FIG. 5.

FIG. 20 schematically shows the body BR during operation of an N-channel MOS transistor in a case where the power supply voltage Vdd1=0.8 V, where in a case in which gate voltage within a range of 0 V to Vdd1 is applied to the gate electrode GT, a depletion layer spreads, whereby the body BR is brought into the fully-depleted state. It is revealed that the body BR is fully depleted at a lower power supply voltage compared with the case of body fixing which has been described with reference to FIG. 6.

In general, an NMOS transistor has a characteristic that it is easily turned on because a threshold value drops when the body voltage rises, and the body voltage rises together with the gate voltage in a case where the gate-body-directly-connected structure is employed in an SOI device. This is described in Y. Hirano et al., IEDM, pp. 35-38, December 2003.

As described above, the gate-body-directly-connected transistor is capable of further reducing the power supply voltage, which is an effective technique for at ultra-low voltage operation in the future. MOS transistors constituting a logic gate are configured such that a depletion state of a body changes due to a change in power supply voltage, and a body potential of the MOS transistor is controlled by directly connecting a gate and a body to each other, which enables high-speed operation at much lower voltage.

E. Second Modification

In the semiconductor integrated circuit device 100 which has been described with reference to FIG. 1, the description has been given assuming that a body voltage control type logic gate is fully applied in the logic circuit LC and a body voltage control type logic gate is partially applied in the memory circuit MC. However, there may be employed a configuration in which all circuits are composed of body voltage control type circuits in advance and two types of lines composed of a voltage-fixed line (non-power-down compliant) and a voltage-controlled line (power-down compliant) are wired as power supply lines for supplying from the outside.

Figure 21:
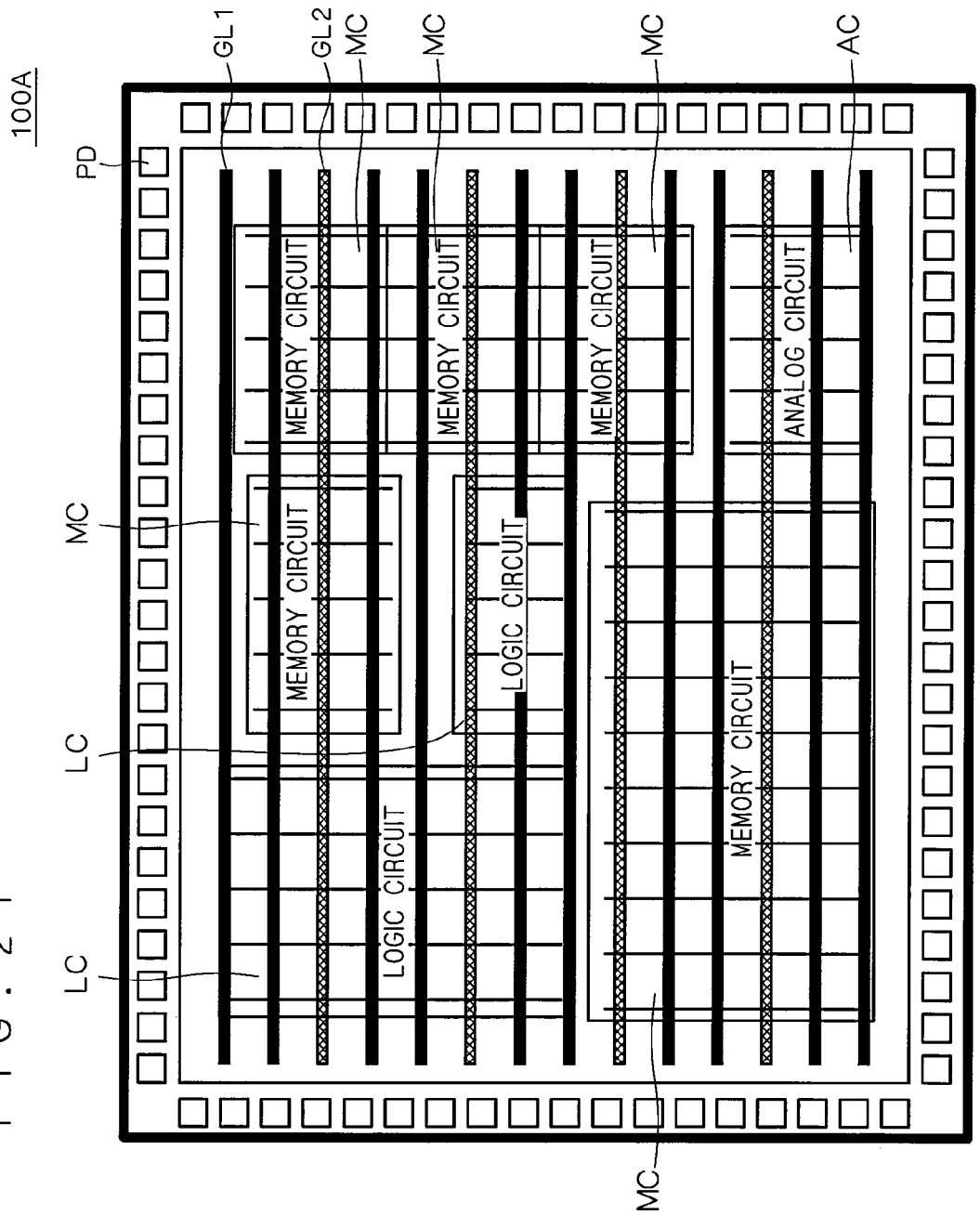
FIG. 21 is a block diagram showing a configuration of a modification of a semiconductor integrated circuit device according to the present invention.

That is, as a semiconductor integrated circuit device 100A shown in FIG. 21, a plurality of external power supply lines GL1 (voltage-fixed lines) and external power supply lines GL2 (voltage-controlled lines) are arranged so as to extend over the entire chip. One external power supply line GL2 is disposed every two external power supply lines GL1, and the external power supply lines GL2 are disposed so as to be located above all circuits.

When such a configuration is employed, for example, in order to configure the logic circuit LC as a circuit capable of operating at the power supply voltage of, for example, 1.2 V or 0.8 V, configuration may be made so that logic gates constituting the logic circuit LC are supplied with the power supply voltage from the external power supply line GL2. In that case, any of the external power supply lines GL1 on the logic circuit LC may be used for supply of a ground potential. It is possible to use the logic circuit LC in the fully-depleted mode by supplying the MOS transistors constituting the logic gate with the power supply voltage of 1.2 V during a normal operation and to use the logic circuit LC in the partially-depleted mode by supplying the MOS transistors with the power supply voltage of 0.8 V during stand-by. Accordingly, it is possible to obtain a semiconductor integrated circuit device in which a reduction in voltage and a reduction in power consumption are achieved.

As described above, a plurality of types of power supply lines to be connected to circuits are prepared and a combination of the power supply line and the circuit is determined in accordance with use of a chip, whereby it is possible to obtain a semiconductor integrated circuit device corresponding to a required specification. Accordingly, verification work is reduced compared with a case of separately manufacturing the body voltage control type and body voltage fixed type logic gates for each specification, which enables a reduction in manufacturing cost.

F. Fourth Embodiment

Finally, as a fourth embodiment of the semiconductor integrated circuit device according to the present invention, description will be given of a configuration in which the self-correcting reference voltage generating circuit 200 shown in FIG. 13 is incorporated in a system-on-a-chip (SOC) as an on-chip regulator.

First, with reference to FIG. 22, description will be given of a typical configuration in a case where power is supplied to an SOC circuit SC in which a logic circuit used in a mobile device and the like are incorporated for comparison.

Figure 22:
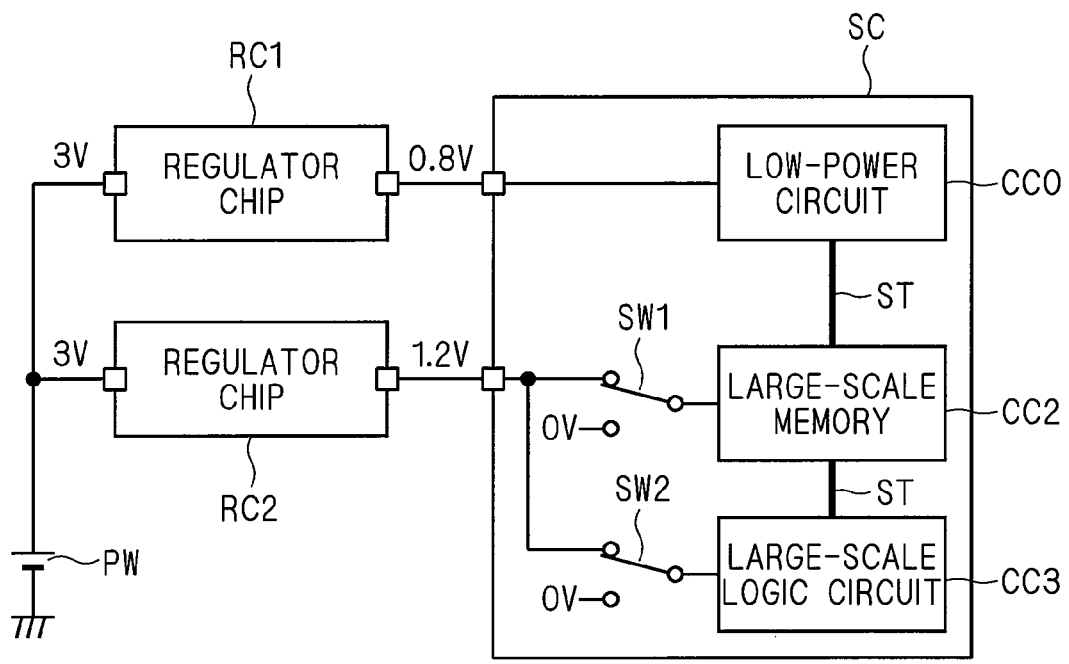
FIG. 22 is a block diagram showing a typical configuration in a case where an SOC circuit in which a logic circuit and the like are incorporated is supplied with power.

As shown in FIG. 22, the SOC circuit SC includes a low-power circuit CC0 (first semiconductor integrated circuit) which needs to be applied with power even in a case where a main power switch of a mobile device is turned off, a large-scale memory CC2 (second semiconductor integrated circuit) which is a DRAM for graphic rendering or the like, and a large-scale logic circuit CC3 (second semiconductor integrated circuit) for control of a liquid crystal display (LCD), such as a micro processing unit (MPU) and a digital signal processor (DSP).

The low-power circuit CC0 includes, for example, a logic circuit which consumes low power, a clock timer, a counter, and a data holding memory, which is configured so that a power supply voltage of 0.8 V is constantly supplied from a regulator chip RC1 provided to an outside of a chip.

On the other hand, the large-scale memory CC2 and the large-scale logic circuit CC3 are circuits which are not required to operate during stand-by of a mobile device, which are configured so that a power supply voltage of 1.2 V is supplied from a regulator chip RC2 provided to the outside of the chip during normal operation (normal mode), whereas voltage supply is individually interrupted by changeover switches SW1 and SW2 during stand-by (stand-by mode).

The reason why the configuration as described above is employed is that ideally, all circuits of the SOC circuit SC should be driven at the power supply voltage of 0.8 V because the power supply voltage is desired to be low in terms of power consumption. However, 0.8 V is a minimum operating voltage of a DRAM or an SRAM, and thus the large-scale memory CC2 does not operate, and an influence of voltage drop due to interconnection resistance is large. Therefore, only the low-power circuit CC0 is driven at 0.8 V and other circuits are driven at 1.2 V.

For this reason, two types of external regulator chips of 0.8 V and 1.2 V are required. In addition, between the low-power circuit CC0 and the large-scale logic circuit CC3, there is provided a signal transfer system between different potentials ST because the need to transfer a signal between different potentials arises.

In this manner, regulator chips are individually prepared for two types of operating voltages, but the regulator chips RC1 and RC2 decrease a voltage of 3 V supplied from, for example, a power source PW such as a lithium ion battery and output voltages of 0.8 V and 1.2 V, respectively. Therefore, their footprints are large, and thus large occupying areas are required, which prevents miniaturization of a device and also leads to an increase in manufacturing cost.

Further, the signal transfer system between different potentials ST has complicated configuration and design and thus, for example, a longer period is required for verification, leading to an increase in design cost.

FIG. 23 shows a configuration in which the self-correcting reference voltage generating circuit 200 shown in FIG. 13 is used as a voltage source of 0.8 V. Note that the same configurations as the configurations shown in FIG. 22 are denoted by the same reference symbols, and overlapping description will be omitted.

As shown in FIG. 23, an SOC circuit SC1 includes a low-power circuit CC1 (first semiconductor integrated circuit), the large-scale memory CC2, the large-scale logic circuit CC3, and a self-correcting on-chip regulator OR (self-correcting power source) which outputs a voltage of 0.8 V. The self-correcting reference voltage generating circuit 200 shown in FIG. 13 is used as this self-correcting on-chip regulator OR.

The SOC circuit SC1 is configured so that it is supplied with a power supply voltage of 1.2 V from a regulator chip RC provided to the outside of the chip, which becomes a power supply voltage of the large-scale memory CC2 and the large-scale logic circuit CC3 in the normal mode but, in the stand-by mode, voltage supply is individually interrupted by the changeover switches SW1 and SW2. Note that the power supply voltage of 1.2 V supplied from the regulator chip RC also becomes a power supply voltage of the self-correcting on-chip regulator OR. On the other hand, the low-power circuit CC1 is configured to be supplied with a power supply voltage of 1.2 V in the normal mode, and to be supplied with an output voltage of 0.8 V of the self-correcting on-chip regulator OR by a changeover switch SW0 in the stand-by mode.

The low-power circuit CC1 includes a low-power-consumption logic circuit, a clock timer, a counter, a data holding memory and the like as in the case of the low-power circuit CC0 shown in FIG. 22. However, their logic gates are configured by using MOS transistors in which switching is made between the fully-depleted mode and the partially-depleted mode in a case where the power supply voltage changes, whereby an operating frequency does not change.

That is, if a logic gate which is formed exactly in the same manner as the inverters IV1 and IV2 constituting the body control oscillators 1 and 2 of the self-correcting reference voltage generating circuit 200 shown in FIG. 13, respectively, is used in the low-power circuit CC1, the logic gate is brought into the fully-depleted mode in a case where the power supply voltage is 1.2 V. For example, if the oscillation frequency is 232 MHz, it is possible to obtain a logic gate whose delay time per stage is 4 nsec/100=40 psec.

Further, in a case where the power supply voltage is 0.8 V, the body voltage VP is 0 V, and the body voltage VN is 0.8 V, the partially-depleted mode is obtained. Also in this case, it is possible to obtain a logic gate whose delay time per stage is 40 psec.

Therefore, in the low-power circuit CC1, the operating frequency is the same in cases where the power supply voltage is 1.2 V and 0.8 V. Even in the case of the stand-by mode, the same operation as that of the normal mode is enabled.

Further, as described with reference to FIG. 13, the self-correcting reference voltage generating circuit 200 makes self-correction such that the reference voltage Vdd2 is kept at 0.8 V, and a stable output voltage of 0.8 V can be obtained if the reference voltage Vdd2 is taken as an output voltage, which is suitable for a voltage source. Note that an output voltage of 1.2 V of the regulator chip RC is supplied as the power supply voltages Vdd and Vdd1 in the self-correcting reference voltage generating circuit 200.

As described above, the self-correcting reference voltage generating circuit 200 is used as the self-correcting on-chip regulator OR, and the power supply voltage of 0.8 V is generated in the SOC circuit SC1, whereby only one type of a regulator chip is required. Accordingly, an area occupied by a regulator chip is reduced, and a manufacturing cost is reduced as well.

In the normal mode, the low-power circuit CC1 and the large-scale logic circuit CC3 operate at 1.2 V, and thus a signal transfer system between different potentials is not required, which prevents an increase in design cost.

While the invention has been shown and described in detail, the foregoing description is in all aspects illustrative and not restrictive. It is therefore understood that numerous modifications and variations can be devised without departing from the scope of the invention.

The invention claimed:

1. A semiconductor integrated circuit device comprising a plurality of logic gates, wherein:
   each of said plurality of logic gates includes MOS transistors, the MOS transistors having, in accordance with a power supply voltage, two states of a partially-depleted state in which a region which is not depleted remains in a channel region and a fully-depleted state in which said channel region is fully depleted;
   said MOS transistors are configured so that a body including said channel region is electrically separated from a semiconductor substrate and a potential of said body is set to an appropriate potential; and
   said body is applied with a positive body voltage in said partially-depleted state so that an operating speed in a case where first power supply voltages indicating said partially-depleted state are supplied is equal to an operating speed in a case where a second power supply voltage indicating said fully-depleted state is supplied.

2. The semiconductor integrated circuit device according to claim 1, wherein:
   said MOS transistors are formed on an SOI substrate including said semiconductor substrate, a buried oxide film disposed on said semiconductor substrate, and an SOI layer disposed on said buried oxide film; and
   said body is formed within a surface of said SOI layer, a periphery thereof being surrounded by an isolation insulating film.

3. The semiconductor integrated circuit device according to claim 2, wherein said body of said MOS transistor is applied with, as said body voltage, a voltage higher than a ground potential in a case of an N-channel MOS transistor and a voltage lower than said power supply voltage in a case of a P-channel MOS transistor.

4. The semiconductor integrated circuit device according to claim 1, wherein a delay amount of each of said plurality of logic gates changes discontinuously at said power supply voltage becoming a border between said partially-depleted state and said fully-depleted state of said MOS transistor.

5. The semiconductor integrated circuit device according to claim 2, wherein said body and a gate of said MOS transistor are electrically connected to each other.

6. The semiconductor integrated circuit device according to claim 1, wherein:
   said first power supply voltages are supplied from an outside;
   said second power supply voltage is generated in said semiconductor integrated circuit device by an internal voltage generating circuit; and said internal voltage generating circuit includes:
- a first ring oscillator driven by said first power supply voltage and composed of said MOS transistors;
- a second ring oscillator driven by said second power supply voltage and composed of said MOS transistors;
- a phase comparator comparing phases of first and second frequencies at which said first and second ring oscillators oscillate, respectively; and
- a correction circuit correcting, based on a comparison result by said phase comparator, said second power supply voltage supplied to said second ring oscillator so that said second frequency is equal to said first frequency.

7. The semiconductor integrated circuit device according to claim 1, wherein:
said first and second power supply voltages are supplied from an outside;
said body voltage applied to said body of said MOS transistor is generated in said semiconductor integrated circuit device by an internal voltage generating circuit; and
said internal voltage generating circuit includes:
- a first ring oscillator driven by said first power supply voltage and composed of said MOS transistors;
- a second ring oscillator driven by said second power supply voltage and composed of said MOS transistors;
- a phase comparator comparing phases of first and second frequencies at which said first and second ring oscillators oscillate, respectively; and
- a correction circuit correcting, based on a comparison result by said phase comparator, said body voltage applied to said body of said MOS transistors constituting said second ring oscillator so that said second frequency is equal to said first frequency.

8. The semiconductor integrated circuit device according to claim 6, wherein:
said semiconductor integrated circuit device includes:
- a first semiconductor integrated circuit;
- second semiconductor integrated circuits; and
- a self-correcting power source outputting said second power supply voltage with said first power supply voltage supplied from said outside being as an operating voltage;

said self-correcting power source includes said internal voltage generating circuit and outputs said second power supply voltage corrected by said correction circuit;
said first semiconductor integrated circuit includes said plurality of logic gates, is supplied with said first power supply voltage during normal operation of said semiconductor integrated circuit device, and is supplied with said second power supply voltage lower than said first power supply voltage during stand-by of said semiconductor integrated circuit device;
said second semiconductor integrated circuit is supplied with said first power supply voltage during normal operation of said semiconductor integrated circuit device, and supply of said first power supply voltages is interrupted during stand-by of said semiconductor integrated circuit device;
said first and second semiconductor integrated circuits and said self-correcting power source are formed on a common SOI substrate including said semiconductor substrate, a buried oxide film disposed on said semiconductor substrate, and an SOI layer disposed on said buried oxide film; and
said body is formed within a surface of said SOI layer, a periphery thereof being surrounded by an isolation insulating film.

9. A semiconductor integrated circuit device, comprising:
a first semiconductor integrated circuit;
second semiconductor integrated circuits; and
a power source outputting a second power supply voltage with a first power supply voltage supplied from an outside being as an operating voltage, wherein:
said first semiconductor integrated circuit is supplied with said first power supply voltage during normal operation of said semiconductor integrated circuit device, and is supplied with said second power supply voltage lower than said first power supply voltage during stand-by of said semiconductor integrated circuit device;
said second semiconductor integrated circuit is supplied with said first power supply voltage during normal operation of said semiconductor integrated circuit device, and supply of said first power supply voltage is interrupted during stand-by of said semiconductor integrated circuit device;
said first semiconductor integrated circuit and said power source comprise a plurality of logic gates including MOS transistors having, in accordance with a power supply voltage, two states of a partially-depleted state in which a region which is not depleted remains in a channel region and a fully-depleted state in which said channel region is fully depleted;
said MOS transistors are configured so that a body including said channel region is electrically separated from a semiconductor substrate and a potential of said body is set to an appropriate potential;
said body is applied with a positive body voltage in said partially-depleted state so that an operating speed in a case where said first power supply voltage indicating said partially-depleted state is supplied is equal to an operating speed in a case where said second power supply voltage indicating said fully-depleted state is supplied;
said first and second semiconductor integrated circuits and said power source are formed on a common SOI substrate including a semiconductor substrate, a buried oxide film disposed on said semiconductor substrate, and an SOI layer disposed on said buried oxide film; and
said body is formed within a surface of said SOI layer, a periphery thereof being surrounded by an isolation insulating film.

* * * * *